(12) United States Patent
Popovich et al.

(10) Patent No.: US 9,727,772 B2
(45) Date of Patent: Aug. 8, 2017

(54) METHOD AND APPARATUS FOR CONTACT IMAGE SENSING

(71) Applicants: Milan Momcilo Popovich, Leicester (GB); Jonathan David Waldern, Los Altos Hills, CA (US)

(72) Inventors: Milan Momcilo Popovich, Leicester (GB); Jonathan David Waldern, Los Altos Hills, CA (US)

(73) Assignee: DIGILENS, INC., Sunnyvale, CA (US)

( * ) Notice: Subject to any disclaimer, the term of this patent is extended or adjusted under 35 U.S.C. 154(b) by 0 days.

(21) Appl. No.: 14/910,921

(22) PCT Filed: Jul. 30, 2014

(86) PCT No.: PCT/GB2014/000295
§ 371 (c)(1),
(2) Date: Feb. 8, 2016

(87) PCT Pub. No.: WO2015/015138
PCT Pub. Date: Feb. 5, 2015

(65) Prior Publication Data
US 2016/0283773 A1      Sep. 29, 2016

Related U.S. Application Data

(60) Provisional application No. 61/958,552, filed on Jul. 31, 2013.

(51) Int. Cl.
*G06K 9/00* (2006.01)
*G02B 26/08* (2006.01)
(Continued)

(52) U.S. Cl.
CPC ....... *G06K 9/00046* (2013.01); *G02B 5/1828* (2013.01); *G02B 6/0026* (2013.01);
(Continued)

(58) Field of Classification Search
CPC ...... G02B 5/30; G02B 6/0026; G02B 6/0053; G02B 6/0056; G02B 6/0076; G02B 6/34;
(Continued)

(56) References Cited

U.S. PATENT DOCUMENTS 1,043,938 A   11/1912   Huttenlocher
3,482,498 A   12/1969   Becker
(Continued)

FOREIGN PATENT DOCUMENTS

EP   1526709      4/2005
WO   2005001753   1/2005
(Continued)

OTHER PUBLICATIONS

International Search Report for PCT/GB2014/000295, Completed by the European Patent Office on Nov. 18, 2014, 4 Pages.
(Continued)

*Primary Examiner* — Ali Bayat
(74) *Attorney, Agent, or Firm* — Brooks Kushman P.C.

(57) ABSTRACT

A contact image sensor having an illumination source; a first SBG array device; a transmission grating; a second SBG array device; a waveguiding layer including a multiplicity of waveguide cores separated by cladding material; an upper clad layer; and a platen. The sensor further includes: an input element for coupling light from the illumination source into the first SBG array; a coupling element for coupling light out of the cores into output optical paths coupled to a detector having at least one photosensitive element.

19 Claims, 27 Drawing Sheets

(51) Int. Cl.
*H01L 27/146* (2006.01)
*G02B 6/34* (2006.01)
*G02B 5/18* (2006.01)
*G02B 27/42* (2006.01)
*F21V 8/00* (2006.01)

(52) U.S. Cl.
CPC ............. *G02B 6/0076* (2013.01); *G02B 6/34* (2013.01); *G02B 26/0808* (2013.01); *G02B 27/4277* (2013.01); *G06K 9/0004* (2013.01); *H01L 27/14678* (2013.01)

(58) Field of Classification Search
CPC ............ G02B 26/0808; G02B 27/1086; G02B 27/143; G02B 27/0172; G06K 9/00046; G06K 9/0004; H01L 27/14678
See application file for complete search history.

(56) References Cited

U.S. PATENT DOCUMENTS

| | | | |
|---|---|---|---|
| 3,975,711 A | 8/1976 | McMahon | |
| 4,322,163 A | 3/1982 | Schiller | |
| 4,544,267 A | 10/1985 | Schiller | |
| 4,765,703 A | 8/1988 | Suzuki et al. | |
| 4,811,414 A | 3/1989 | Fishbine et al. | |
| 4,933,976 A | 6/1990 | Fishbine et al. | |
| 5,751,452 A | 5/1998 | Tanaka et al. | |
| 5,892,599 A | 4/1999 | Bahuguna | |
| 5,942,157 A | 8/1999 | Sutherland et al. | |
| 6,061,463 A | 5/2000 | Metz et al. | |
| 2005/0265585 A1* | 12/2005 | Rowe | G06K 9/0012 382/124 |
| 2005/0271258 A1* | 12/2005 | Rowe | G06K 9/00046 382/124 |
| 2006/0119837 A1 | 6/2006 | Raguin et al. | |
| 2006/0132914 A1* | 6/2006 | Weiss | G02B 5/32 359/462 |
| 2008/0298649 A1* | 12/2008 | Ennis | G06K 9/00046 382/125 |
| 2011/0063604 A1* | 3/2011 | Hamre | G02F 1/1326 356/71 |
| 2012/0194420 A1* | 8/2012 | Osterhout | G02B 27/0093 345/156 |
| 2014/0063055 A1* | 3/2014 | Osterhout | G06F 3/005 345/633 |
| 2015/0010265 A1 | 1/2015 | Popovich et al. | |
| 2016/0209648 A1* | 7/2016 | Haddick | G02B 27/0093 |

FOREIGN PATENT DOCUMENTS

| | | |
|---|---|---|
| WO | 2007130130 | 11/2007 |
| WO | 2011032005 | 3/2011 |
| WO | 2011110821 | 9/2011 |
| WO | 2012158950 | 11/2012 |
| WO | 2013027006 | 2/2013 |
| WO | 2013102759 | 7/2013 |

OTHER PUBLICATIONS

Drake et al. Optical Engineering Sep. 1996, vol. 35, No. 9, p. 2499-2505, "Waveguide hologram fingerprint entry device".
International Search Report for PCT/GB2011/000349, Completed by the European Patent Office on Aug. 17, 2011, 4 Pages.
International Search Report for PCT/GB2013/000005, Completed by the European Patent Office on Jul. 16, 2013, 3 Pages.

* cited by examiner

| SUB SYSTEM | LAYER | SYMBOL IN FIG.1 | REFRACTIVE INDEX (785 NM.) | LAYER THICKNESS (MICRONS) |
|---|---|---|---|---|
| FIRST SBG ARRAY | SBG LOWER SUBSTRATE | 21 | 1.4987 | 1100 |
| | FIRST SBG ARRAY | 20 | 1.5400 | 4 |
| | SBG UPPER CELL GLASS | 22 | 1.4987 | 500 |
| | AIR GAP ABOVE SBG | 23 | 1.0000 | 5 |
| TRANSMISSION GRATING | TRANSMISSION GRATING | 43 | 1.4856 | 50 |
| | LOW INDEX GLASS (CLAD GLUE) | 42 | 1.4100 | 5 |
| SECOND SBG ARRAY | SBG SUBSTRATE | 41 | 1.4987 | 300 |
| | SECOND SBG ARRAY | 4 | 1.5400 | 4 |
| DETECTOR WAVEGUIDE | BARRIER FILM | 40C | 1.5000 | 5 |
| | WAVEGUIDE CORE | 50 | 1.5100 | 22 |
| | BOTTOM BUFFER (CLAD) | 51 | 1.4060 | 16 |
| | PRIMING LAYER | 61 | 1.5000 | 5 |
| PLATEN | PLATEN | 6 | 1.4987 | 400 |

FIG. 18

METHOD AND APPARATUS FOR CONTACT IMAGE SENSING

CROSS-REFERENCE TO RELATED APPLICATIONS

This application is the U.S. national phase of PCT Application No. PCT/GB2014/000295 filed on Jul. 30, 2014, which claims the benefit of U.S. Provisional Patent Application No. 61/958,552 filed on Jul. 31, 2013, the disclosures of which are incorporated in their entirety by reference herein.

The following patent applications are hereby incorporated by reference herein in their entireties: PCT Application No.: PCT/GB2012/000680 entitled IMPROVEMENTS TO HOLOGRAPHIC POLYMER DISPERSED LIQUID CRYSTAL MATERIALS AND DEVICES with filing date 7 Jan. 2013; PCT Application No.: PCT/GB2012/000729 entitled METHOD AND APPARATUS FOR SWITCHING ELECTRO OPTICAL ARRAYS with filing date 6 Sep. 2012; PCT Application No.: PCT/GB2013/000005 entitled CONTACT IMAGE SENSOR USING SWITCHABLE BRAGG GRATINGS with filing date 7 Jan. 2013; and U.S. Pat. No. 8,354,640 entitled OPTICALLY-BASED PLANAR SCANNER with issue date 15 Jan. 2013.

TECHNICAL FIELD

The present invention relates to an imaging sensor, and more particularly to a contact image sensor using electrically switchable Bragg gratings.

BACKGROUND

A contact image sensor is an integrated module that comprises an illumination system, an optical imaging system and a light-sensing system—all within a single compact component. The object to be imaged is place in contact with a transparent outer surface (or platen) of the sensor. Well known applications of contact image sensors include document scanners, bar code readers and optical identification technology. Another field of application is in biometric sensors, where there is growing interest in automatic finger print detection. Fingerprints are a unique marker for a person, even an identical twin, allowing trained personnel or software to detect differences between individuals. Fingerprinting using the traditional method of inking a finger and applying the inked finger to paper can be extremely time-consuming. Digital technology has advanced the art of fingerprinting by allowing images to be scanned and the image digitized and recorded in a manner that can be searched by computer. Problems can arise due to the quality of inked images. For example, applying too much or too little ink may result in blurred or vague images. Further, the process of scanning an inked image can be time-consuming. A better approach is to use "live scanning" in which the fingerprint is scanned directly from the subject's finger. More specifically, live scans are those procedures which capture fingerprint ridge detail in a manner which allows for the immediate processing of the fingerprint image with a computer. Examples of such fingerprinting systems are disclosed in Fishbine et al. (U.S. Pat. Nos. 4,811,414 and 4,933,976); Becker (U.S. Pat. No. 3,482,498); McMahon (U.S. Pat. No. 3,975,711); and Schiller (U.S. Pat. Nos. 4,544,267 and 4,322,163). A live scanner must be able to capture an image at a resolution of 500 dots per inch (dpi) or greater and have generally uniform gray shading across a platen scanning area. There is relevant prior art in the field of optical data processing in which optical waveguides and electro-optical switches are used to provide scanned illumination. One prior art waveguide illuminator is disclosed in U.S. Pat. No. 4,765,703. This device is an electro-optic beam deflector for deflecting a light beam within a predetermined range of angle. It includes an array of channel waveguides and plural pairs of surface electrodes formed on the surface of a planar substrate of an electro-optic material such as single crystal Lithium Niobate ($LiNbO_3$).

While the fingerprinting systems disclosed in the foregoing patents are capable of providing optical or optical and mechanical fingerprint images, such systems are only suitable for use at a central location such as a police station. Such a system is clearly not ideal for law enforcement and security applications where there is the need to perform an immediate identity and background check on an individual while in the field. In general, current contact image sensor technology tends to be bulky, low in resolution and unsuitable for operation in the field. Thus there exists a need for a portable, high resolution, lightweight optical contact sensor for generating images in the field.

SUMMARY

It is an object of the present invention to provide a portable, high resolution, lightweight contact image sensor for generating images in the field.

In a first embodiment of the invention a contact image sensor according to the principles of the invention comprises the following parallel optical layers configured as a stack: an illumination means for providing a collimated beam of first polarisation light; a first SBG array device further comprising first and second transparent substrates sandwiching an array of selectively switchable SBG column elements, and ITO electrodes applied to opposing faces of the substrates and the SBG substrates together providing a first TIR (total internal reflection) light guide for transmitting light in a first TIR beam direction; an air gap; a transmission grating; a third transparent substrate (low index glue layer); a SBG cover glass; a ITO layer; a second SBG array device comprising an array of selectively switchable SBG column elements; a ITO layer; a barrier film; a waveguiding layer comprising a multiplicity of waveguide cores separated by cladding material having a generally lower refractive index than the cores, the cores being disposed parallel to the first beam direction; an upper clad layer having a generally lower refractive index than the cores; a priming layer; and a platen. The apparatus further comprises: means for coupling light from the illumination means into the first TIR light guide; means for coupling light out of the core into an output optical path; and a detector comprising at least one photosensitive element, the photosensitive element being optically coupled to at least one core. ITO electrodes are applied to the opposing faces of the third transparent substrate and the waveguiding layer. The column elements of the first and second SBG arrays have longer dimensions disposed orthogonally to the first TIR beam direction. In one embodiment of the invention the air gap may be replaced by a refracting material layer.

Each SBG element in the first and second SBG arrays has a diffracting state when no electric field is present across the ITO electrodes and a non-diffracting state when an electric field is present across the ITO electrodes, the SBG elements diffracting only the first polarization light.

The elements of the second SBG device which are in a non-diffracting state have a generally lower refractive index than the cores. The third transparent substrate has a generally lower refractive index than the cores. At any time one element of the first SBG array is in a diffracting state, one element of the second SBG array is in a diffracting state, and all other elements of the first and second are in a non-diffracting state.

In one embodiment of the invention an active SBG element of the first SBG array in a diffracting state diffracts incident first TIR light upwards into a first beam direction. The transmission grating diffracts the first beam direction light upwards into a second beam direction. When contact is made with an external material at a point on the platen a portion of the second beam direction light incident at the point on the platen contacted by said external material is transmitted out of the platen. All other light incident on the outer surface of the platen is reflected downwards in a third optical path, the third optical path traversing the cores. An active SBG element of the second SBG array along the third beam direction diffracts the third angle light downwards into a fourth beam direction. The fourth beam direction light is reflected upwards at the third transparent substrate into a fifth beam direction. The fifth beam direction light exceeds the critical angle set by the core/clad interface and the critical angle set by one of the core/second SBG array or second SBG array/third transparent substrate interfaces, providing a TIR path to the detector. The first to fifth beam directions lie in a plane orthogonal to the first SBG array.

In one embodiment of the invention the third transparent substrate has a generally lower refractive index than the element of the second SBG array in its diffracting state.

In one embodiment of the invention the third transparent substrate has a generally lower refractive index than the element of the second SBG array in its non-diffracting state.

In one embodiment of the invention the apparatus further comprises a transparent slab of index lower than that of the third substrate disposed between the third substrate and the transmission grating.

In one embodiment of the invention the output from detector array element is read out in synchronism with the switching of the elements of the first SBG array.

In one embodiment of the invention the apparatus further comprises a transparent slab of index lower than that of the third substrate disposed between the third substrate and the transmission grating. An active SBG element of the first SBG array in a diffracting state diffracts incident first TIR light upwards into a first optical path in a plane orthogonal to the first SBG array. The transmission grating diffracts the first optical path light upwards into a second optical path. When contact is made with an external material at a point on the platen a portion of the second beam direction light incident at the point on the platen contacted by said external material is transmitted out of the platen. All other light incident on the outer surface of the platen is reflected downwards in a third optical path, the third optical path traversing the cores. The third optical path traverses the core. An active SBG element of the second SBG array along the third optical path diffracts the third angle light downwards into a fourth optical path. The fourth optical path light is reflected upwards at least one of the third transparent substrate or the slab into a fifth optical path. The fifth optical path light exceeds the critical angle set by the core/clad interface and the critical angle set by one of the core/second SBG array, second SBG array/third substrate or third substrate/slab interfaces, providing a TIR path to the detector. The first to fifth optical paths lie in a plane orthogonal to the first SBG array.

In one embodiment of the invention the illumination means comprises a laser and a collimator lens.

In one embodiment of the invention the means for coupling light from the illumination means into the first TIR light guide is a grating.

In one embodiment of the invention the means for coupling light from the illumination means into the first TIR light guide is a prismatic element.

In one embodiment of the invention the means for coupling the second TIR light into the waveguide is a grating.

In one embodiment of the invention the means for coupling light out of the waveguide is a grating.

In one embodiment of the invention the first and second SBG arrays each comprise continuous SBG layers and the selectively switchable elements of first and second SBG arrays are defined by configuring at least one of the transparent electrodes as a multiplicity of selectively switchable electrode elements.

In one embodiment of the invention an air gap is provided between the first SBG array and the transmission grating.

In one embodiment of the invention the sensor further comprises a priming layer between the upper clad layer and the platen.

In one embodiment of the invention at least one of the transparent electrodes and substrates sandwiches a barrier layer.

In one embodiment of the invention the transparent substrates are fabricated from plastic.

In one embodiment of the invention the transparent substrates are fabricated from a polycarbonate In one embodiment of the invention the waveguide cores are fabricated from an electrically conductive material.

In one embodiment of the invention the waveguide cores are fabricated from PDOT

In one embodiment of the invention the waveguide cores are fabricated from CNT.

In one embodiment of the invention the waveguides are fabricated from CNT using a lift-off stamping process.

In one embodiment of the invention the waveguides are coupled to linear array of detectors.

In one embodiment of the invention the waveguides are coupled to a two dimensional detector array.

In one embodiment of the invention the transparent electrodes are fabricated from ITO.

In one embodiment of the invention the transparent electrodes are fabricated from CNT.

In one embodiment of the invention the transparent electrodes are fabricated from PDOT.

In one embodiment of the invention the waveguides are fabricated from PDOT.

In one embodiment of the invention the waveguide cores are fabricated from a conductive photopolymer the waveguide cores and second SBG array elements being disposed such that only the portions off the SBG array elements lying directly under the waveguide cores are switched.

In one embodiment of the invention the SBG arrays are fabricated using a reverse mode HPDLC.

In one embodiment of the invention there is provided a method of making a contact image measurement comprising the steps of:

a) providing an apparatus comprising the following parallel optical layers configured as a stack: an illumination means for providing a collimated beam of first polarisation light; a first SBG array device further comprising first and second transparent substrates sandwiching an array of selectively switchable SBG column elements, and ITO electrodes applied to opposing faces of the substrates and the SBG substrates together providing a first TIR light guide for transmitting light in a first beam direction; an air gap; a transmission grating; a transparent substrate (low index glue); an SBG cover glass; a ITO layer; a second SBG array device comprising array of selectively switchable SBG column elements; a ITO layer; a barrier film; a waveguiding layer comprising a multiplicity of waveguide cores separated by cladding material having a generally lower refractive index than the cores, the cores being disposed parallel to the first beam direction; an upper clad layer having a generally lower refractive index than the cores (which is also referred to as the bottom buffer); a priming layer; a platen; and further comprising: means for coupling light from the illumination means into the first TIR light guide; means for coupling light out of the waveguide into an output optical path; and a detector comprising at least one photosensitive element, wherein ITO electrodes are applied to the opposing faces of the substrate and the waveguide core;

b) an external material contacting a point on the external surface of the platen;

c) sequentially switching elements of the first SBG array into a diffracting state, all other elements being in their non-diffracting states;

d) sequentially switching elements of the second SBG array into a diffracting state, all other elements being in their non-diffracting states;

e) each diffracting SBG element of the first SBG array diffracting incident first TIR light upwards into a first optical path, f) the transmission grating diffracting the first optical path light upwards into a second optical path, g) a portion of the second optical path light incident at the point on the platen contacted by said external material being transmitted out of the platen and any other light being reflected downwards in a third optical path, the third optical path traversing one the core, h) an active SBG element of the second SBG array along the third optical path diffracting the third angle light downwards into a fourth optical path, i) the fourth optical path light being reflected upwards into a fifth optical path at the third substrate, the fifth optical path light exceeding the critical angle set by the core/clad interface and the critical angle set by one of the core/second SBG array or second SBG array/third substrate interfaces, and proceeding along a TIR path to the detector.

The first to fifth optical paths lie in a plane orthogonal to the first SBG array.

In one embodiment of the invention the method further comprises a transparent slab of index lower than the substrate disposed between the substrate and the transmission grating, such that the fourth optical path light is reflected upwards at the substrate into a fifth optical path and the fifth optical path light exceeds the critical angle set by the core/clad interface and the critical angle set by one of the core/second SBG array, second SBG array/third substrate or third substrate/slab interfaces, providing a TIR path to the detector.

In one embodiment of the invention the air gap may be replaced by a refracting material layer.

In one embodiment of the invention the illumination means comprises a multiplicity of laser illumination channels, each said channel comprising a laser and collimating lens system. The illumination means provides a multiplicity of collimated, abutting beams of rectangular cross section.

In one embodiment of the invention the illumination means comprises a laser and a collimator lens. The said illumination means provides a collimated beam of rectangular cross section.

In one embodiment of the invention the optical wave guiding structure comprises a multiplicity of parallel strip cores separated by cladding material.

In one embodiment of the invention the optical wave guiding structure comprises a single layer core.

In one embodiment of the invention the SBG elements are strips aligned normal to the propagation direction of the TIR light.

In one embodiment of the invention the SBG elements are switched sequentially across the SBG array and only one SBG element is in its diffracting state at any time.

In one embodiment of the invention the sensor further comprises a micro lens array disposed between the SBG device and the first cladding layer.

In one embodiment of the invention the means for coupling light from the illumination means into the first TIR light guide is a grating.

The illumination device of claim the means for coupling light from the illumination means into the first TIR light guide is a prismatic element.

In one embodiment of the invention the means for coupling the second TIR light into the wave-guiding structure is a grating.

In one embodiment of the invention the means for coupling light out of the wave-guiding structure is a grating.

In one embodiment of the invention, the output light from the wave guiding device is coupled into a linear detector array.

In one embodiment of the invention, the output light from the wave guiding device is coupled into a two dimensional detector array.

In one embodiment of the invention a contact image sensor further comprises a half wave retarder array disposed between the air gap and the transmission grating. The half wave retarder array comprises an array of column-shaped elements sandwiched by transparent substrates. Each retarder element in the half wave retarder array is switchable between a polarization rotating state in which it rotates the polarization of incident light through ninety degrees and a non polarization rotating state. The column elements of the half wave retarder array have longer dimensions disposed parallel the first TIR beam direction. Each half wave retarder array element overlaps at least one strip element of the first SBG array. At any time one element of the first SBG array is in a diffracting state and is overlapped by an element of the half wave retarder array in its non-polarization rotating state, one element of the second SBG array is in a diffracting state, all other elements of the first and second SBG arrays are in a non-diffracting state and all other elements of the half wave retarder array are in their polarization rotating states.

One embodiment of the invention uses a SBG waveguiding structure. In this embodiment there is provided a contact image sensor comprising the following parallel optical layers configured as a stack: an illumination means for providing a collimated beam of first polarisation light; a first SBG array device further comprising first and second transparent substrates sandwiching an array of selectively switchable SBG column, and transparent electrodes applied to opposing faces of said substrate, the SBG substrates together providing a first TIR light guide for transmitting light in a first TIR beam direction; a transmission grating; a second SBG array device further comprising third and fourth transparent substrates sandwiching a multiplicity of high index HPDLC regions separated by low index HPDLC regions and patterned transparent electrodes applied to opposing faces of the substrates; and a platen. The apparatus and further comprises: means for coupling light from the illumination means into the first TIR light guide; means for coupling light out of the second SBG array device into an output optical path; and a detector comprising at least one photosensitive element. The high index regions provide waveguiding cores disposed parallel to the first beam direction. The low index HPDLC regions provide waveguide cladding. The third and fourth substrate layers have a generally lower refractive index than the cores. The patterned electrodes applied to the third substrate comprise column shaped elements defining a multiplicity of selectively switchable columns of SBG elements which are aligned orthogonally to the waveguiding cores. The patterned electrodes applied to the fourth substrate comprise elongate elements overlapping the low index HPDLC regions. The detector comprises an array of photosensitive elements, each photosensitive element being optically coupled to at least one waveguiding core. Each SBG element in the first and second SBG arrays is switchable between a diffracting state and a non-diffracting state with the SBG elements diffracting only first polarization light.

In one embodiment of the invention based on an SBG waveguiding structure the diffracting state exists when an electric field is applied across the SBG element and a non diffracting state exists when no electric field is applied.

In one embodiment of the invention based on an SBG waveguiding structure the diffracting state exists when no electric field is applied across the SBG element and the non diffracting states exists when an electric field is applied.

In one embodiment based on an SBG waveguiding structure, at any time, one element of the first SBG array is in a diffracting state, one element of the second SBG array is in a diffracting state, and all other elements of the first and second are in a non-diffracting state.

In one embodiment of the invention based on an SBG waveguiding structure an active SBG element of the first SBG array in a diffracting state diffracts incident first TIR light upwards into a first beam direction. The transmission grating diffracts the first beam direction light upwards into a second beam direction. When contact is made with an external material at a point on the platen a portion of the second beam direction light incident at the point on the platen contacted by the external material is transmitted out of the platen. Light incident on the outer surface of the platen in the absence of external material is reflected downwards in a third optical path which traverses the cores. An active column of the second SBG array along the third beam direction diffracts the third angle light into a second TIR path down the traversed core towards the detector. The first to third optical paths and the first and second TIR paths lie in a common plane.

In one embodiment of the invention based on an SBG waveguiding structure the output from detector array element is read out in synchronism with the switching of the elements of the first SBG array.

In one embodiment of the invention based on an SBG waveguiding structure there is provided an air gap between the first SBG array and the transmission grating.

In one embodiment of the invention based on an SBG waveguiding structure there is provided a method of making a contact image measurement comprising the steps of:

a) providing an apparatus comprising the following parallel optical layers configured as a stack: an illumination means for providing a collimated beam of first polarisation light; a first SBG array device further comprising first and second transparent substrates sandwiching an array of selectively switchable SBG column elements, and transparent electrodes applied to opposing faces of the substrates and the SBG substrates together providing a first TIR light guide for transmitting light in a first beam direction; a transmission grating; a transparent substrate; a second SBG array device further comprising third and fourth substrates sandwiching a multiplicity of high index HPDLC regions separated by low index HPDLC regions and patterned transparent electrodes applied to opposing faces of the substrates; a platen; and a detector; and further comprising: means for coupling light from the illumination means into the first TIR light guide; means for coupling light out of the second SBG array device into an output optical path; and a detector comprising at least one photosensitive element; the high index regions providing waveguiding cores disposed parallel to the first beam direction and the low index HPDLC regions providing waveguide cladding; the substrates layers having a generally lower refractive index than the cores, the patterned electrodes applied to the third substrate defining a multiplicity of selectively switchable columns orthogonal to the waveguiding cores and the patterned electrodes applied to the fourth substrate overlapping the low index HPDLC regions;

b) an external material contacting a point on the external surface of the platen;

c) sequentially switching elements of the first SBG array into a diffracting state, all other elements being in their non-diffracting states;

d) sequentially switching columns of the second SBG array device into a diffracting state, all other columns being in their non-diffracting states;

e) each diffracting SBG element of the first SBG array diffracting incident first TIR light upwards into a first optical path, f) the transmission grating diffracting the first optical path light upwards into a second optical path, g) a portion of the second optical path light incident at the point on the platen contacted by the external material being transmitted out of the platen, while portions of said second optical path light not incident at the point are reflected downwards in a third optical path, the third optical path traversing one core, h) an active SBG column element of the second SBG array along the third optical path diffracting the third angle light in a second TIR path down the traversed core and proceeding along a TIR path along the core to the detector.

In one embodiment of the invention there is provided a contact image sensor using a single SBG array layer comprising: an illumination means for providing a collimated beam of first polarisation light; an SBG array device further comprising first and second transparent substrates sandwiching an array of selectively switchable SBG columns, and transparent electrodes applied to opposing faces of the substrates, said SBG substrates together providing a first TIR light guide for transmitting light in a first TIR beam direction; a first transmission grating layer overlaying the lower substrate of the SBG array device; a second transmission grating layer overlaying the upper substrates of the SBG array device; a quarter wavelength retarder layer overlaying the second transmission grating layer; a platen overlaying thy quarter wavelength retarder layer; and a polarization rotating reflecting layer overlaying the first transmission grating layer. The apparatus further comprises: means for coupling light from said illumination means into said SBG array device; means for coupling light out of the second SBG array device into an output optical path; and a detector comprising at least one photosensitive element.

In one embodiment of the invention a contact image sensor comprises: an illumination means for providing a collimated beam of first polarization light; an illuminator waveguide for propagating light in a first TIR path containing a first array of switchable grating columns; a detector waveguide for propagating light in a second TIR path containing a second array of switchable grating columns; a beam steering means comprising at least one grating disposed between the platen and the detector waveguide; a first waveguide coupler for coupling light from the illumination means into the illuminator waveguide; a second waveguide coupler for coupling light out of the detector waveguide into an output optical path; a detector comprising at least one photosensitive element; and a platen. Each switchable grating element in the first and second switchable grating arrays is switchable between a diffracting state and a non-diffracting state. The switchable grating elements diffract only the first polarization light. Each external surface of the detector waveguide is divided into a first grid of strips interspersed with a second grid of strips. The first and second grids have different light-modifying characteristics. Overlapping strips from the first grid of strips on each external surface are operative to waveguide light. Overlapping strips from the second grid of strips on each external surface are operative to absorb light scattered out of regions of the detector waveguide sandwiched by overlapping strips from the first grid of strips on each external surface. The strips are orthogonal to the switchable grating columns.

In one embodiment the first grid of each external waveguide surface is one of clear or scattering and the second grid of at least one external waveguide surface is infrared absorbing.

In one embodiment the beam steering means comprises: a first transmission grating layer; a half wavelength retarder layer overlaying the first transmission grating layer; a second transmission grating layer overlaying the half wavelength retarder layer; and a quarter wavelength retarder layer sandwiched by the second transmission grating layer and the platen.

In one embodiment the external faces of the detector waveguide and the illuminator waveguide abut an air space or a low refractive index material layer.

In one embodiment the first waveguide coupler couples light from the illumination means into the first TIR path in the illuminator waveguide. A switchable grating element of the illuminator waveguide in a diffracting state diffracts the first TIR path light towards the platen into a first beam direction. The beam steering means deflects the first beam direction light towards the platen in a second beam direction. When contact is made with an external material at a point on the platen a portion of the second beam direction light incident at the point on the platen contacted by the external material is transmitted out of the platen. Light incident on the outer surface of the platen in the absence of the contact with an external material is reflected towards the detector waveguide in a third optical path. An active column of the second switchable grating array along the third beam direction diffracts the third angle light into a second TIR path in the detector waveguide. The second waveguide coupler couples the second TIR path light into an output optical path towards the detector. In one embodiment the first to third optical paths and the first and second TIR paths are in a common plane. In one embodiment the first direction light traverses the detector waveguide. In one embodiment the second direction light traverses the illuminator waveguide.

In one embodiment a method of making a contact image measurement is provided comprising the steps of:

a) providing an apparatus comprising: an illumination means for providing a collimated beam of first polarisation light; an illuminator waveguide for propagating light in a first TIR beam direction containing a first array of switchable grating columns; a detector waveguide for propagating light in a first TIR beam direction containing a second array of switchable grating columns; a beam steering means comprising at least one grating disposed between the platen and the detector waveguide; a first waveguide coupler for coupling light from the illumination means into the illuminator waveguide; a platen; a second waveguide coupler for coupling light out of the detector waveguide into an output optical path; and a detector comprising at least one photosensitive element. The external surfaces of the detector waveguide comprise interspersed multiplicities of strips with different light modifying characteristics. The strips are orthogonal to the switchable grating columns, each light modifying strip overlapping a clear strip;

b) coupling light from the illumination means into the illuminator waveguide;

c) an external material contacting a point on the external surface of the platen;

d) sequentially switching elements of the first switchable grating array into a diffracting state, all other elements being in their non-diffracting states;

e) sequentially switching columns of the second switchable grating array into a diffracting state, all other columns being in their non-diffracting states;

f) each diffracting switchable grating element of the first switchable grating array diffracting incident first TIR light upwards into a first optical path;

g) the beam steering means deflecting the first optical path light into a second optical path;

h) a portion of the second optical path light incident at the point on the platen contacted by the external material being transmitted out of the platen, portions of the second optical path light not incident at the point being reflected into a third optical path;

i) an active switchable grating column element of the second switchable grating array along the third optical path diffracting the third angle light in a second TIR path; and j) coupling light out of the detector waveguide towards the detector.

In one embodiment the first to third optical paths and the first and second TIR paths are in a common plane.

A more complete understanding of the invention can be obtained by considering the following detailed description in conjunction with the accompanying drawings wherein like index numerals indicate like parts. For purposes of clarity, details relating to technical material that is known in the technical fields related to the invention have not been described in detail.

BRIEF DESCRIPTION OF THE DRAWINGS

FIG. 18 is a table showing typical refractive indices and layer thicknesses used in the first embodiment of the invention.

DETAILED DESCRIPTION

Figure 1:
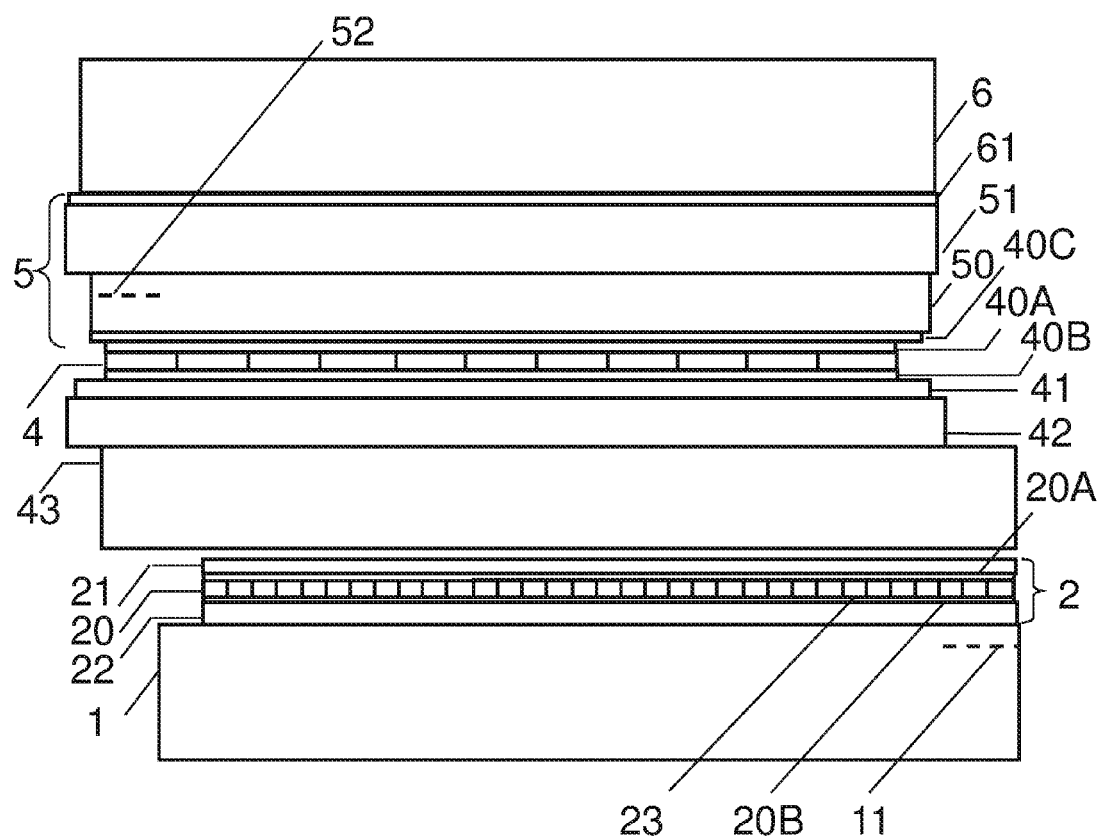
FIG. 1 is a schematic side elevation view of a contact image sensor in a first embodiment of the invention.

It will be apparent to those skilled in the art that the present invention may be practiced with some or all of the present invention as disclosed in the following description. For the purposes of explaining the invention well-known features of optical technology known to those skilled in the art of optical design and visual displays have been omitted or simplified in order not to obscure the basic principles of the invention.

Unless otherwise stated the term "on-axis" in relation to a ray or a beam direction refers to propagation parallel to an axis normal to the surfaces of the optical components described in relation to the invention. In the following description the terms light, ray, beam and direction may be used interchangeably and in association with each other to indicate the direction of propagation of light energy along rectilinear trajectories.

Parts of the following description will be presented using terminology commonly employed by those skilled in the art of optical design.

It should also be noted that in the following description of the invention repeated usage of the phrase "in one embodiment" does not necessarily refer to the same embodiment.

In the following description the term "grating" will refer to a Bragg grating. The term "switchable grating" will refer to a Bragg grating that can be electrically switched between an active or diffracting state and an inactive or non-diffractive state. In the embodiments to be described below the preferred switchable grating will be a Switchable Bragg Grating (SBG) recording in a Holographic Polymer Dispersed Liquid Crystal (HPDLC) material. The principles of SBGs will be described in more detail below. For the purposes of the invention a non switchable grating may be based on any material or process currently used for fabricating Bragg gratings. For example the grating may be recorded in a holographic photopolymer material.

An SBG comprises a HPDLC grating layer sandwiched between a pair of transparent substrates to which transparent electrode coatings have been applied. The first and second beam deflectors essentially comprise planar fringe Bragg gratings. Each beam deflector diffracts incident planar light waves through an angle determined by the Bragg equation to provide planar diffracted light waves.

An (SBG) is formed by recording a volume phase grating, or hologram, in a polymer dispersed liquid crystal (PDLC) mixture. Typically, SBG devices are fabricated by first placing a thin film of a mixture of photopolymerizable monomers and liquid crystal material between parallel glass plates. Techniques for making and filling glass cells are well known in the liquid crystal display industry. One or both glass plates support electrodes, typically transparent indium tin oxide films, for applying an electric field across the PDLC layer. A volume phase grating is then recorded by illuminating the liquid material with two mutually coherent laser beams, which interfere to form the desired grating structure. During the recording process, the monomers polymerize and the HPDLC mixture undergoes a phase separation, creating regions densely populated by liquid crystal micro-droplets, interspersed with regions of clear polymer. The alternating liquid crystal-rich and liquid crystal-depleted regions form the fringe planes of the grating. The resulting volume phase grating can exhibit very high diffraction efficiency, which may be controlled by the magnitude of the electric field applied across the PDLC layer. When an electric field is applied to the hologram via transparent electrodes, the natural orientation of the LC droplets is changed causing the refractive index modulation of the fringes to reduce and the hologram diffraction efficiency to drop to very low levels resulting in for a "non diffracting" state. Note that the diffraction efficiency of the device can be adjusted, by means of the applied voltage, over a continuous range from near 100% efficiency with no voltage applied to essentially zero efficiency with a sufficiently high voltage applied. U.S. Pat. No. 5,942,157 and U.S. Pat. No. 5,751,452 describe monomer and liquid crystal material combinations suitable for fabricating SBG devices.

To simplify the description of the invention the electrodes and the circuits and drive electronics required to perform switching of the SBG elements are not illustrated in the Figures. Methods for fabricated patterned electrodes suitable for use in the present invention are disclosed in PCT US2006/043938. Other methods for fabricating electrodes and schemes for switching SBG devices are to be found in the literature. The present invention does not rely on any particular method for fabricating transparent switching electrodes or any particular scheme for switching arrays of SBGs. Although the description makes reference to SBG arrays the invention may be applied using any type of switchable grating.

To clarify certain geometrical of aspects of the invention reference will be made to the orthogonal XYZ coordinate system where appropriate.

Figure 2:
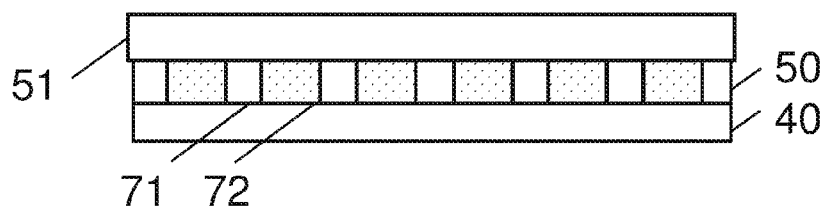
FIG. 2 is a schematic front elevation of the waveguiding structure used in the first embodiment of the invention showing the cross sections of the waveguide cores and cladding.

A contact image sensor according to the principles of the invention is illustrated in the schematic side elevation view of FIG. 1. The apparatus comprises the following parallel optical layers configured as a stack: an illumination means 1 for providing a collimated beam of first polarized light; a first SBG array device 2 further comprising first and second transparent substrates 21,22 sandwiching an array 20 of selectively switchable SBG column elements, and ITO electrodes 20A,20B applied to opposing faces of the substrates, the SBG substrates together providing a first TIR light guide for transmitting light in a first TIR beam direction; an air gap 23; a transmission grating 43; a third transparent substrate (low index glue layer 42; a low refractive index SBG cover glass 41; a ITO layer 40B; a second SBG array device 4 comprising an array of selectively switchable SBG column elements; a ITO layer 40B; a barrier film 40C; a waveguiding layer 50 comprising a multiplicity of waveguide cores separated by cladding material having a generally lower refractive index than the cores, the cores being disposed parallel to the first beam direction; an upper clad layer 51 having a generally lower refractive index than the cores (which is also referred to as the bottom buffer); a priming layer 61; and a platen 6. Each core of the waveguide structure is optically couple to an element of a detector array. The details of the waveguide to detector coupling will be discussed later. The apparatus further comprises: means for coupling light from the illumination means into the first TIR light guide; means for coupling light out of the core into an output optical path; and a detector comprising at least one photosensitive element, the photosensitive element being optically coupled to at least one the core. The illumination means may further comprise optical stops to eliminate stray light and scatter. The first polarized light may be either S or P polarized. Since SBGs recorded in the inventors preferred HPDLC material system are P-polarization sensitive that polarization will be assumed for the purposes of describing he invention. The transmission grating 43 is advantageously a conventional transmission Bragg grating recorded in a holographic photopolymer. However, other equivalent means for providing a transmission grating may be used. Desirably, the contact image sensor uses infrared light from at least one laser. In one embodiment of the invention the light wavelength is 785 nanometers. A cross sectional view (in the XZ plane) of the waveguiding structure is shown in FIG. 2 which illustrates the waveguiding structure 40 sandwiched by the barrier film 40C and the clad layer 51 (or bottom buffer). A core 71 and a region of cladding 72 between adjacent cores is indicted in the drawing.

In functional terms the first SBG device 20 comprises an array of strips or columns aligned normal to the light propagation direction of the TIR light. The second SBG array also comprises an array of strips or columns aligned parallel to the strips in the first SBG device. The SBGs in the first and second SBG arrays are recorded as single continuous element in each case. Transparent electrodes are applied to the opposing surfaces of the substrates 21,22 with at least one electrode being patterned to define the SBG elements. As explained above each SBG element in the first and second SBG arrays has a diffracting state when no electric field is present across the ITO electrodes and a non-diffracting state when an electric field is present across the ITO electrodes, the SBG elements diffracting only the first polarization light. Transparent electrodes are applied to the opposing faces of the third transparent substrate and the waveguiding layer with at least one electrode being patterned to define the SBG elements. Typically the first SBG array has a resolution of 1600 elements. The resolution of the second SBG array is lower, typically 512 elements.

The column elements of the first and second SBG arrays have longer dimensions disposed orthogonally to the first TIR beam direction. The elements of the second SBG device which are in a non-diffracting state have a generally lower refractive index than the waveguide cores. The third transparent substrate has a generally lower refractive index than the cores. At any time one element of the first SBG array is in a diffracting state, one element of the second SBG array is in a diffracting state, all other elements of the first and second SBG arrays are in a non-diffracting state.

In the embodiment illustrated in FIG. 1 all of the above described layers (apart from the air gap 23 between the upper substrate 21 of the first SBG and the transmission grating 43) are in contact, forming a laminated structure. It should be noted that the relative dimensions of the various layers are greatly exaggerated in the drawing. In one embodiment of the invention the air gap 23 may be replace by a refracting material layer. The second SBG array 4 acts as the lower cladding layer of the wave guiding structure while the waveguide core 50 and the third transparent substrate 41 act as the containing substrates of the second SBG array device 4. The first and second transparent substrates 21,22 sandwiching the first SBG array together provide a first TIR light guide with the TIR occurring in the plane of the drawing. The second SBG array device 4 is sandwiched by the waveguide core and the third transparent substrate 41 which form a second TIR light guide.

The contact image sensor further comprises a means 11 for coupling light from said illumination means 1 into the first SBG array lightguide. The invention does not assume any particular coupling means. One particular solution discussed later is based on prismatic elements. In one embodiment the coupling means may be based on gratings. The contact image sensor further comprises a means for coupling light out of the wave-guiding structure into an output optical path leading to a detector. The coupling means which schematically represented by the dashed line 52 is advantageously a grating device which will be discussed in more detail later.

Figures 3A, 3B:
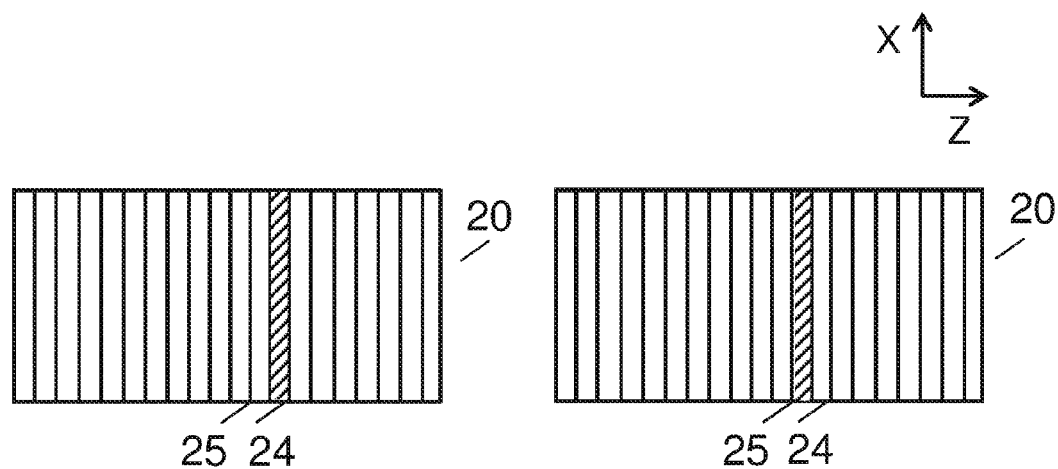
FIG. 3A is a schematic plan view of a first operational state of an SBG device used in a first embodiment of the invention.
FIG. 3B is a schematic plan view of a second operational state of an SBG device used in a first embodiment of the invention.

The column elements of the first and second SBG arrays are switched sequentially in scrolling fashion, backwards and forwards. In each SBG array the SBG elements are switched sequentially across the SBG array and only one SBG element in each array is in its diffracting state at any time. The effect is to produce a narrow scanning column of light that sweeps backwards and forwards across the platen. The disposition of the SBG elements in the first SBG array is illustrated in FIGS. 3A-3B which provides schematic plan views of the SBG array 20 at two consecutive switching states. In the first state illustrated in FIG. 3A the SBG element indicated by 25 is in its diffracting state and all other SBG elements are in their non diffracting states, allowing TIR light to be transmitted through the arrays without substantial transmission loss or path deviation. In the second state illustrated in FIG. 3B the SBG element 24 is switched to its non-diffracting stated while the adjacent element 25 is switched to its diffracting state.

Figure 4:
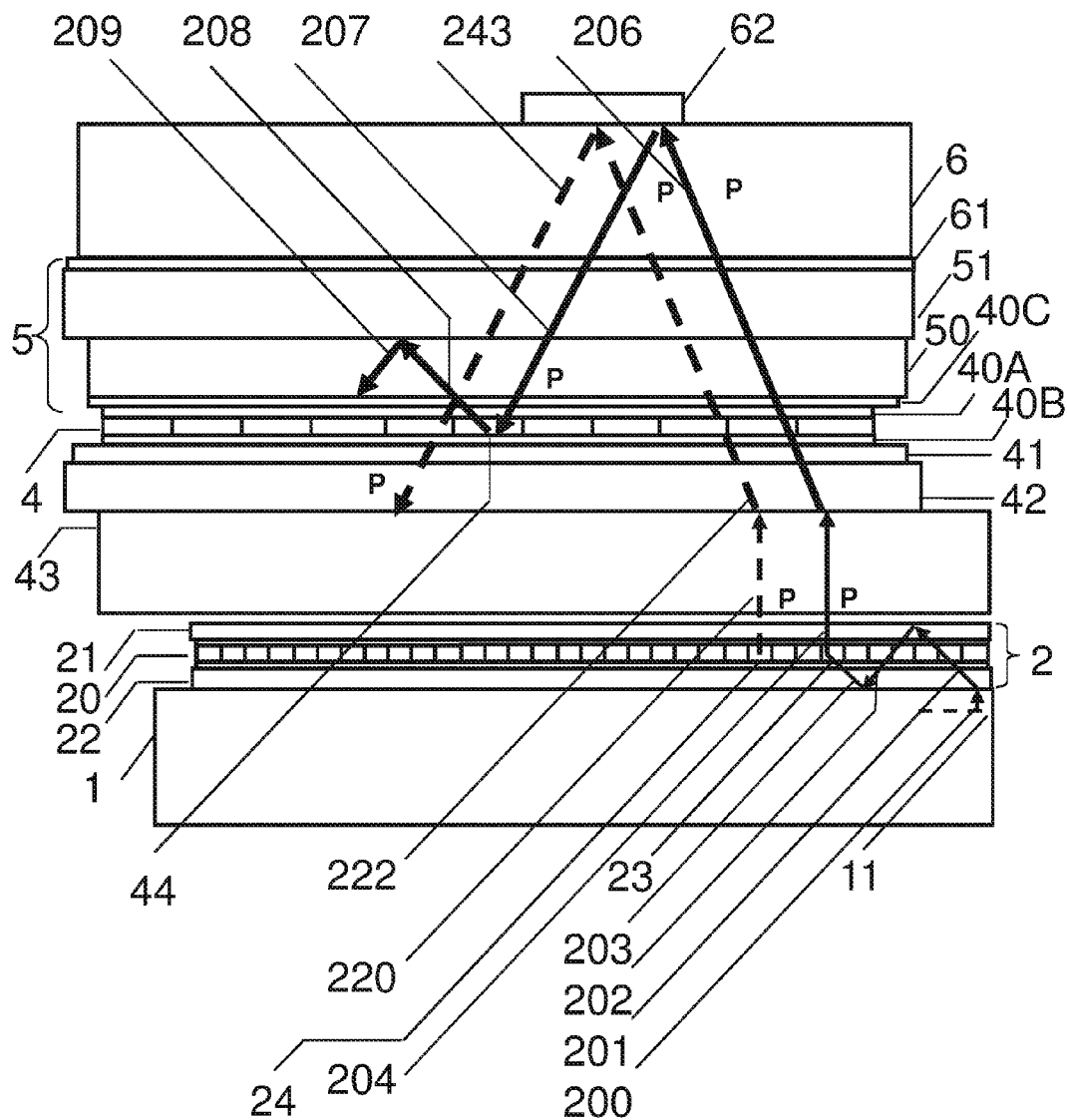
FIG. 4 is a schematic side elevation view of a contact image sensor in a first embodiment of the invention showing the principle ray paths.

We next discuss the operation of the device with reference to the schematic side elevation views of FIG. 4-5. By considering the path of P-polarized collimated light through the device in the plane of each drawing. Incident light 200 from the illuminator means 1 is coupled into the first SBG device 2 by a coupling means indicated by 11 which will be discussed below. The light undergoes TIR in the light guide formed by the substrates 21,22 as indicted by the rays 201-203. The active (i.e. diffracting) SBG column element 23 diffracts light 204 out of the light guide The light 204 is now diffracted by the transmission grating into the ray 206 which propagates towards the platen without significant deviation or loss through the intervening optical layers. The symbol P indicates that the light is P-polarized, i.e. it retains the polarization of the input laser light.

During a scan the fingers are placed onto the scanner surface. In the absence of finger contact the light incident on the platen outer surface is totally internally reflected downwards towards the wave guiding structure 50 and then on to the detector. When finger contact is made the finger skin touching the platen surface causes reflection at the outer surface of the platen to be frustrated such that light leaks out of the platen. The parts of the finger skin that touch the platen surface therefore becomes the dark part of the finger print image because light never makes it to the detector array. The X coordinate of the contacting feature is given by the detector array element providing the dark-level or minimum output signal. The latter will be determined by the noise level of the detector. The Y coordinate of the contacting feature is computed from the geometry of the ray path from the last SBG element in the first SBG array that was in a diffracting state just prior to TIR occurring in the platen and a signal from the reflected light being recorded at the detector. The ray path is computed using the diffraction angle and the thicknesses and refractive indices of the optical layers between the SBG element and the platen surface.

In one embodiment of the invention an alternative detection scheme is based on the principle that in the absence of any external pressure art the platen/air interface the incident light is transmitted out of the platen. Now, external pressure from a body 62 of refractive index lower than the platen (which may a feature such as a finger print ridge or some other entity) applied on the outer side of the platen layer causes the light to be totally internally reflected downwards towards the wave guiding structure 50. Hence the X coordinate of the contacting feature is now given by the detector array element providing the peak output signal. The procedure for computing the Y coordinate remains unchanged.

An SBG when in the state designated as "non-diffracting" will, in practice, have a very small refractive index modulation and will therefore diffract a small amount of light. This residual diffraction is negligible in most applications of SBGs. However, in applications such as the present invention any residual refractive modulation will result in a small amount of light being diffracted out of the light guide. For example referring to FIG. 4, SBG elements such as 24 will have a small diffraction efficiency leading to a small portion of TIR light being diffracted upwards into the ray path represented by the dashed lines and the ray directions indicated by 220-223. This light will follow a parallel oath to the light from the active SBG element (the signal light) and will be reflected off the platen outer surface towards the waveguides. Coupling of this stray light into the waveguides, where it will contribute a background leakage noise to the output signal, is prevented by switching the second SBG array elements in synchronization with the first array elements such that only the element of the first and second SBGs array lying on the signal ray path are in a diffracting state at any time. The readout of the signal from detector array is in turn synchronized with the switching of the elements of the first and second' SBG arrays.

The wave guiding structure 50 and the SBG array 4 together provide the means for coupling light out of the sensor onto a detector array. The SBG provides the lower cladding and the layer 51 provides the upper cladding. The coupling of light into the waveguide relies on the second SBG array which acts as a switchable cladding layer as will be discussed below. The second SBG array is operated in a similar fashion to the first SBG array with column elements being switched sequentially in scrolling fashion, backwards and forwards. Only one SBG element is in a diffracting state at any time. The non-active elements perform the function of a clad material. The role of the active SBG element is to steer incident ray into the TIR angle. It should be appreciated that in order that light reflected down from the platen can be diffracted into a TIR path by an active (diffracting) SBG element the refractive index of the SBG in its active state must be lower than the core index. To maintain TIR the refractive index of the SBG elements that are not in their diffracting states must be lower than that of the core. The operation of the wave-guiding structure will now be explained more clearly referring to FIG. 5A which shows a detail of the wave guiding structure including the cladding 51, core 50, second SBG array 4 and SBG substrate 41. Note that in FIGS. 5A-5B the layers 40A,40B,40C are not illustrated. For the sake of simplifying the description the refraction of light at the optical interfaces will be ignored. The SBG grating is represented by the single Bragg fringe 44. The ray 207 on entering the active SBG element 43 at an incidence angle w is diffracted into the ray 207A. The deflection of the ray is determined by the Bragg diffraction equation. Since the average index of the SBG medium is higher than that of the substrate layer 41 the diffracted ray 207A undergoes TIR within the SBG medium and the reflected ray 208 propagates into the core at an angle u which is slightly higher than the critical angle of the core/cladding interface. The angle u is determined by the slant angles of the Bragg fringes and the incidence angle w. The ray 208 undergoes TIR to give the downward ray 209 which enters the non-diffracting SBG element 45 at the angle u as the ray 210. The ray 210 undergoes TIR at the interface of the SBG element/third substrate and re-enters the core as the ray 211 which from reflection symmetry is at angle u. In some embodiments a small portion of the light in the ray direction 210 may not be totally internally reflected owing to imperfections in the substrate surface. Such light propagates into the substrate and is refracted into the ray direction 212 which is indicated by a dashed line. This process is repeated along the waveguide until the light is coupled out towards the detector. Since all of the remaining SBG elements along the waveguide path are in their non-diffracting states TIR between the cladding layer and the SBG lower substrate continues until the light is couple out of the waveguide towards the detector.

The invention also covers the case where the SBG substrate abuts a low index slab 42 which has a lower index than the third substrate. The layer 42 is not essential in all applications of the invention but will in general provide more scope for optimizing the optical performance of the sensor. Referring to FIG. 5B it will be seen that the ray paths are similar to those of FIG. 5A except that the TIR of the diffracted ray 207A now takes place at the interface between the substrate 41 and the low index slab 42. Accordingly, the diffracted ray 207A is transmitted into the substrate 41 as the ray 207B and undergoes TIR into the ray 207C at the low index layer after transmission through the substrate 41 and the SBG array 4 the ray now indicated by 208A propagates into the core at an angle v which is slightly higher than the critical angle of the core/clad interface. The ray 208A undergoes TIR to give the downward ray 209A which enters the non-activated SBG element 45 as the ray 210A. The ray 210A undergoes TIR at the low index layer as indicated by the rays 211B,211C and re-enters the core as the ray 211A which from reflection symmetry is at angle v. This process is repeated along the waveguide until the light is coupled out towards the detector. It should be appreciated that in situations where the collimation of the beam is not very tightly controlled it is possible that TIR may occur at the SBG substrate index for some rays and at the low index slab substrate for other rays.

In one embodiment of the invention the third transparent substrate has a generally lower refractive index than an element of the second SBG array in its diffracting state.

In one embodiment of the invention the third transparent substrate has a generally lower refractive index than the element of the second SBG array in its non-diffracting state.

Figure 5A:
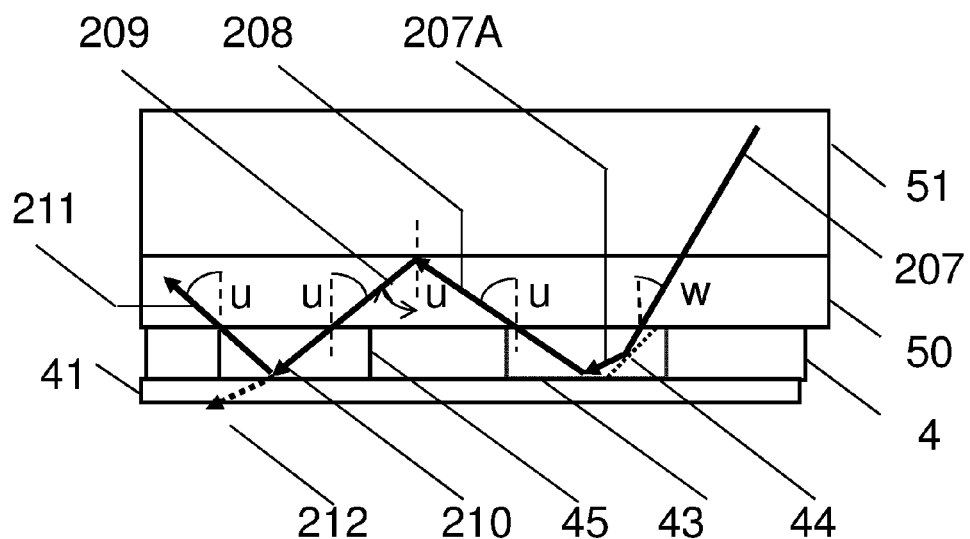
FIG. 5A is a schematic side elevation view of a detail of the contact image sensor showing the ray propagation through the waveguide core and second SBG array in one embodiment of the invention.
Figure 5B:
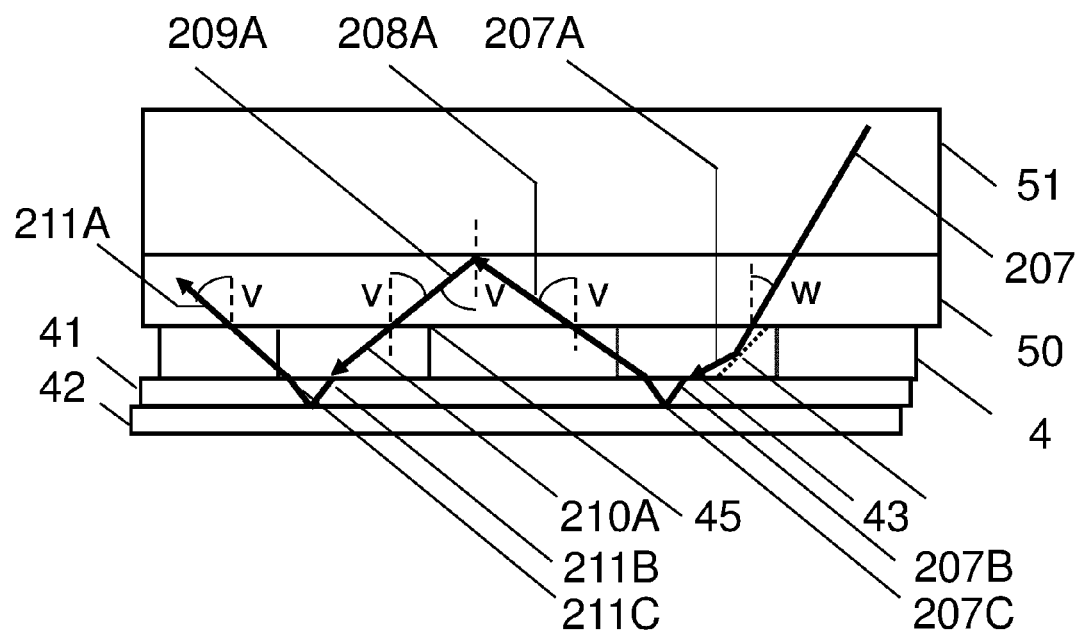
FIG. 5B is a schematic side elevation view of a detail of the contact image sensor showing the ray propagation through the waveguide core and second SBG array in one embodiment of the invention.

As indicated in FIGS. 5A-5B the cleared SBG will still have a small residual refractive index modulation which causes a small amount of the incident light to be diffracted. The direction of diffraction will depend on the TIR angle. In some cases, the ray may not be at the Bragg angle but may still be sufficiently close to the Bragg angle to be diffracted, but with a lower diffraction efficiency. If not diffracted it may end up in the TIR beam, thereby contributing to the output signal.

Turning back to FIGS. 1-2 we see that the wave-guiding structure 50 which is illustrated in schematic plan view in FIG. 1 and in cross section in FIG. 2 comprises a multiplicity of parallel strip waveguides generally indicated by 70, the waveguide core element of one of the waveguides and the surrounding cladding being indicated by numerals 71,72. The invention does not assume any particular waveguide geometry or material for fabricating the waveguiding layer. It should be apparent to those skilled in the art of integrated optics that a large number of different core/cladding combinations may be used in the invention. Typically, the core will have a refractive index of typically between 1.51 to 1.56 or and the cladding layers will have refractive indices in the range from 1.41 to 1.47. Typically, the core may be rectangular with cross sectional dimensions of 25-40 microns in depth×40 microns in width. However, the cores may have much larger or much smaller cross sectional dimensions subject to the specifications for coupling efficiency, waveguide crosstalk and other waveguide parameters set by the application. The wave-guiding structure may use a polymer waveguide core of index typically in the range 1.50 to 1.60 with cladding index typically 1.45 to 1.55. However, the invention does not assume any particular waveguide optical materials. It should be noted by the waveguide cladding in the waveguiding layer 51 and the cladding layer 51 may be fabricated from one material. In some cases, it may be advantages to have more than one cladding material in order to provide better control of the guide wave mode structure. The highest refractive index UV curable material suitable for use as either core or cladding in a high transparency waveguiding structure of the type required in the invention is believed to have a refractive index of about 1.56 at 633 nm. The index might be slightly lower at longer wavelength. The problem with index values above about 1.56 is that the materials become either colored or slightly metallic and hence lose their transparency. Higher index transparent materials exist but they are not UV curable, which makes them unsuitable for waveguide fabrication using currently available embossing process.

Figure 6:
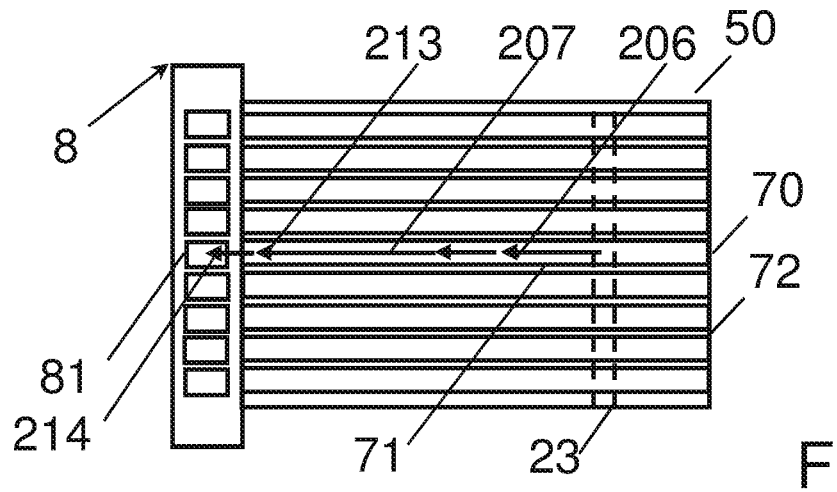
FIG. 6 is a schematic plan view of a wave-guiding structure and detector module used in one embodiment of the invention.
Figure 7:
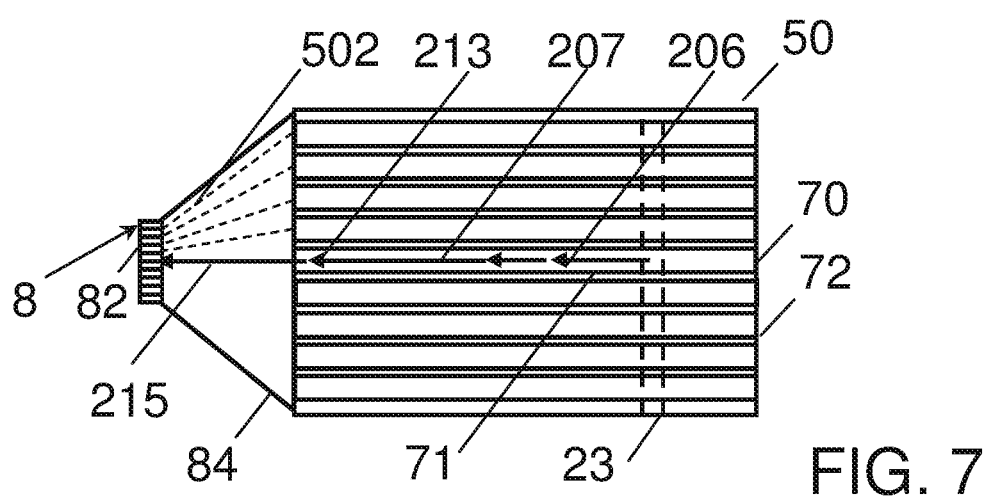
FIG. 7 is a schematic plan view of a wave-guiding structure and detector module used in one embodiment of the invention.
Figure 8:
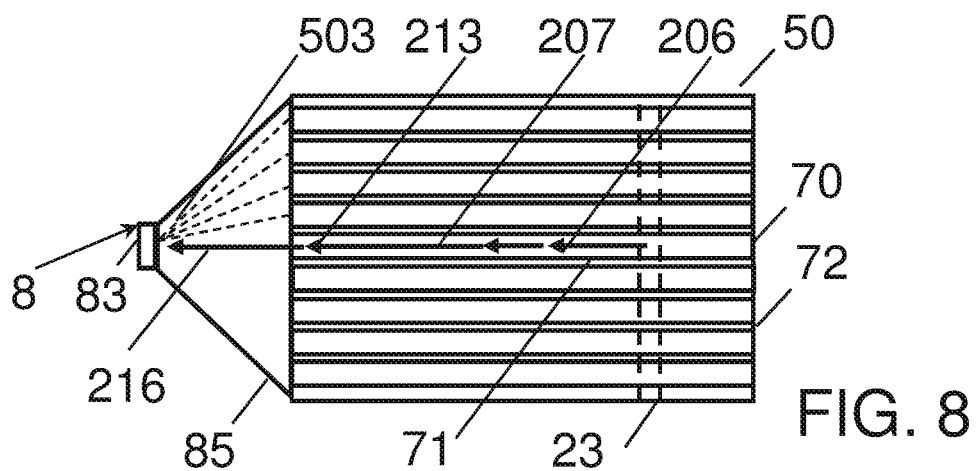
FIG. 8 is a schematic plan view of a wave-guiding structure and detector module used in one embodiment of the invention.

We next discuss the means for coupling light out of the wave-guiding structure into an output optical path leading to a detector. The coupling scheme which was only indicated schematically by the symbol 52 in FIG. 1 may be based on well-known methods using grating couplers, prismatic elements etc. The invention does not rely on any particular method. FIGS. 6-8 provides schematic plan views of alternative schemes for coupling the wave guiding structure 50 to the detector 8. The detector comprises at least one element. A multiplicity of waveguide cores is generally indicated by 70 with a typical core element 71 and the surrounding cladding 71 being indicated in each case. Each core terminates at a coupler linked to a detector element. In each case the ray paths from the active SBG element 23 to the waveguide termination are indicated by 206,207,213 using the numerals of FIG. 4. In the embodiment of FIG. 6 the detector 8 is a linear array of elements such as 81. A ray path from the waveguide termination to the detector is indicated by 214. Advantageously, the cores are each terminated by a 45-degree facet with directs light upwards or downwards (relative to the drawing surface) towards the detector along direction 214 which should be read as normal to the plane of the drawing. The detector pitch matches the core spacing. In one embodiment of the invention a parallel path waveguide routing element may be provided between the waveguide termination and the detector. In the embodiment of FIG. 7 the output light paths generally indicated by 502 from the waveguides are converged onto a linear detector array 8 containing elements 82. The linear detector is much smaller than the width of the platen by means of a convergent path waveguide routing element 84A. A ray path from the waveguide termination to the detector is indicated by 215. In one embodiment of the invention the cores are terminated by a 45-degree facet which directs the light upwards or downwards. In the embodiment of FIG. 8 the output light paths generally indicated by 503 from the waveguides are converged by means of a convergent path waveguide routing element 85 onto a single element detector 83 A ray path from the waveguide termination to the detector is indicated by 216. In one embodiment of the invention the cores are terminated by a 45-degree facet which directs the light upwards or downwards.

Figure 9:
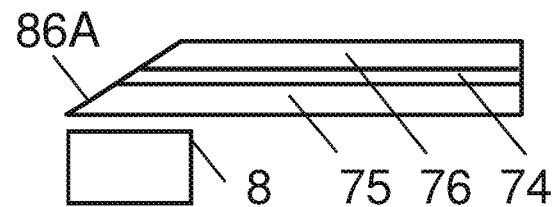
FIG. 9 is a schematic side elevation view of a detection scheme based on terminating waveguides in the wave-guiding structure with an angled polished facet as used in one embodiment of the invention.
Figure 10:
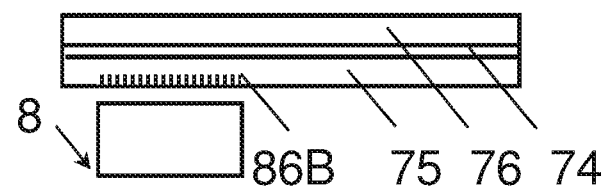
FIG. 10 is a schematic side elevation view of a detection scheme based on applying out coupling gratings to waveguides in the wave-guiding structure as used in one embodiment of the invention.

Many different schemes for providing the waveguiding routing elements referred to above will be known to those skilled in the art of integrated optical systems. The apparatus may further comprise a micro lens array disposed between the waveguide ends and the detector array where the micro lens elements overlap detector elements. FIG. 9 is a schematic side elevation view of one method of coupling light out of the wave-guiding structure in which there is provided a 45-degree facet 86A terminating each waveguide element in the wave-guiding structure. FIG. 9 may be a cross section of any of the schemes illustrated above. The detector 8 and the waveguide cladding layers 75,76 and core 74 are illustrated. The core 74 may be a continuation of one of the cores 70 or a core of material of similar optical properties optically coupled to one of said cores 70. The cladding layer may be a continuation of the cladding layer 51 in FIG. 1 and FIG. 3 or material of similar refractive index. The cladding layer may be continuation of the HPDLC material of the SBG array 4 or material of similar refractive index to the SBG array in its non-active state. FIG. 10 is a schematic side elevation view of another method of coupling light out of the wave-guiding structure in which a grating device 86B is applied to each waveguide element. FIG. 10 may be a cross section of any of the schemes illustrated in FIGS. 7-9. The grating may be a surface relief structure etched into the waveguide cladding. Alternatively, the grating may be a separate layer in optical contact with one or both of the core or cladding. In one embodiment of the invention the grating may be recorded into a cladding layer as a Bragg grating.

Figure 11:
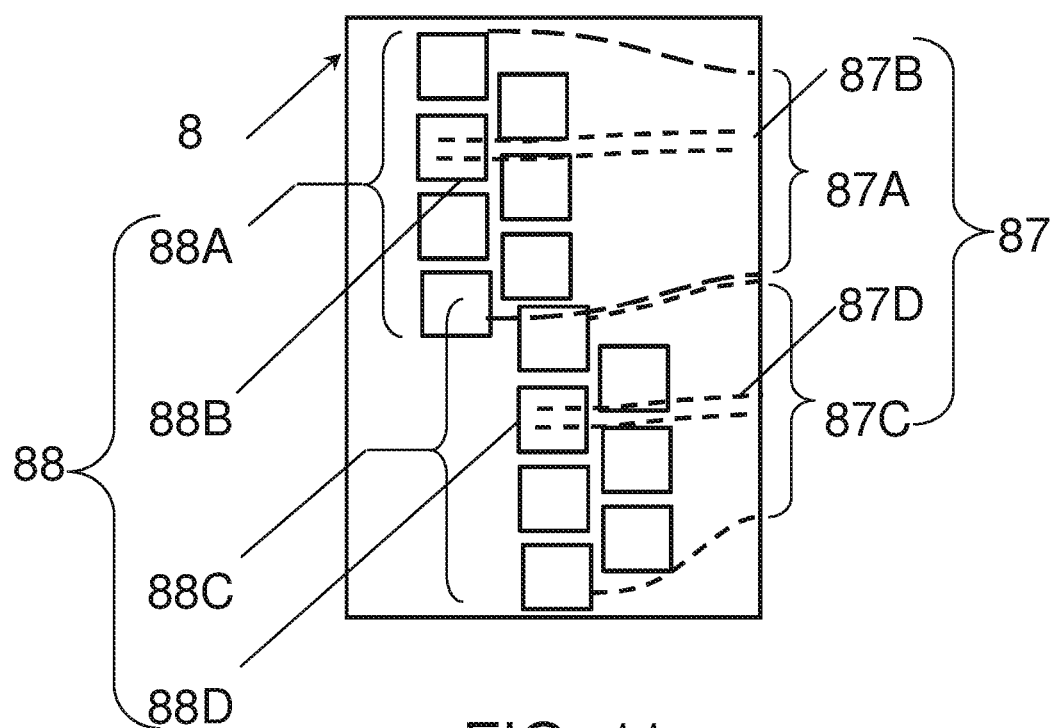
FIG. 11 is a schematic plan view of a detection scheme based on a two dimensional array used in one embodiment of the invention.

In the above described embodiments of the invention the detector 8 is a linear array. In an alternative embodiment of the invention illustrated in FIG. 11 the detector elements are distributed over two dimensions. This avoids some of the alignment problems of coupling waveguide elements to detector elements with a very high resolution linear array. The waveguides from the wave-guiding structure generally indicated by 87 are fanned out in the waveguide groups 87A,87C. The detectors are generally indicated by 88. The waveguide groups 87A,87C contain waveguide cores such as 87B which overlays the detector 88B in the detector group 88A and waveguide 87D which overlays the detector 88D in the detector group 88C. The waveguide to detector computing may employ 45-degree core terminations, gratings, prisms or any other methods known to those skilled in the art. From consideration of FIG. 11 it should be apparent that many alternative configurations for coupling the waveguiding structure to a two dimensional detector array are possible.

In practical embodiments of the invention the beams produced by the illumination means will not be perfectly collimated even with small laser die and highly optimized collimating optics. For this reason, the interactions of the guided beams with the SBG elements will not occur at the optimum angles for maximum Bragg diffraction efficiency (DE) leading to a small drop in the coupling efficiency into the waveguiding structure. Having coupled light into the waveguiding structures there is the problem that some of the light may get coupled out along the TIR path by the residual gratings present in the non-diffracting SBG elements. The reduction in signal to noise ratio (SNR) resulting from the cumulative depletion of the beam by residual gratings along the TIR path in the output waveguide may be an issue in certain applications of the invention. A trade-off may be made between the peak and minimum SBG diffraction efficiencies to reduce such out-coupling. The inventors have found that minimum diffraction efficiencies of 0.02% are readily achievable and efficiencies as low as 0.01% are feasible. To further reduce the risk of light being coupled out of the waveguiding structure, a small amount of diffusion (~0.1%) can be encoded into the SBG to provide a broader range of angles ensuring that guided light is not all at the Bragg angle. A small amount of diffusion will be provided by scatter within the HPDLC material itself. Further angular dispersion of the beam may also be provided by etching both the ITO and the substrate glass during the laser etching of the ITO switching electrode.

In one embodiment of the invention the refractive index modulation of second SBG array is varied along the length of the array during exposure to provide more uniform coupling along the waveguide length. The required variation may be provided by placing a variable neutral density filter in proximity to the SBG cell during the holographic recording. In any case the power depletion along the waveguide can be calibrated fairly accurately.

Only light diffracted out of the active element of the first SBG array should be coupled into the output waveguide structure at any time. In practice the SBG array comprises a continuous grating with the individual elements being defined by the electrode patterning. The gaps between the elements of the first SBG arrays should therefore be made as small as possible to eliminate stray light which might get coupled into the waveguiding layer reducing the SNR of the output signal. Ideally the gap should be not greater than 2 microns. The noise signal contributed by the gaps is integrated over the area of an active column element of the second SBG array element while the light contributing to the useful signal is integrated over the simultaneously active column element of the first SBG array. An estimate of SNR can be made by assuming a common area for the first and second SBG arrays and making the following assumptions: number of elements in the second SBG array: 512; number of elements in first SBG array: 1600; SBG high diffraction efficiency: 95%; and SBG low diffraction efficiency: 0.2%. The SNR is given by [area of second SBG array element× high diffraction efficiency/[area of SBG element×low diffraction efficiency=[1600×0.95]/[52×0.02]=148. Desirably, the SNR should be higher than 100.

In one embodiment of the invention the transparent electrodes are fabricated from PDOT (poly ethylenedioxythiophene) conductive polymer. This material has the advantage of being capable of being spin-coated onto plastics. PDOT (and CNT) eliminates the requirement for barrier films and low temperature coating when using ITO. A PDOT conductive polymer can achieve a resistivity of 100 Ohm/sq. PDOT can be etched using Reactive Ion Etching (RIE) processes.

In one embodiment of the invention the first and second SBG arrays are switched by using a common patterned array of column shaped electrodes. Each element of the second SBG array, which is of lower resolution than the first SBG array uses subgroups of the electrode array.

In one embodiment of the invention the waveguides are fabricated from PDOT. The inventors believe that such a waveguide will exhibit high signal to noise ratio (SNR).

In one embodiment of the invention the waveguides are fabricated from CNT using a lift-off stamping process. An exemplary CNT material and fabrication process is the one provided by OpTIC (Glyndwr Innovations Ltd., St. Asaph, Wales, and United Kingdom).

In one embodiment of the invention the waveguide cores are conductive photopolymer such as PDOT or CNT. Only the portions of the SBG array lying directly under the waveguide cores are switched. This avoids the problems of crosstalk between adjacent waveguide cores thereby improving the SNR at the detector.

In one embodiment of the invention used for finger print detection which uses infrared light of wavelength 785 nm the TIR angle in the platen depends on the refractive indices of the platen glass and the thin layer of water (perspiration) between the subject's skin and the platen. For example, if the platen is made from SF11 glass the refractive index at 785 nm is 1.765643, while the index of water at 785 nm is 1.3283. From Snell's law the arc-sine of the ratio of these two indices: $\sin^{-1}$ (1.3283/1.76564) gives a critical angle of 48.79°. Allowing for the salt content of perspiration we should assume an index of 1.34, which increases the critical angle to 49.37°. Advantageously, the TIR angle at the platen should be further increased to 50° to provide for alignment tolerances, fabrication tolerances, and water variations as well as collimation tolerances too for less than perfect lenses and placements of these parts. Alternatively, other materials may be used for the plate. It is certainly not essential to use a high index to achieve moisture discrimination. One could use an acrylic platen (index 1.49), for example, where the ray angle is in the region of 65°. In practice, however, the choice of platen material will be influenced by the need to provide as large a bend angle as possible at the SBG stage. The reason for this is that higher diffraction efficiencies occur when the bend angle (i.e. the difference between the input angle at the SBG and the diffracted beam angle) is large. Typically bend angles in the region of 20-25° are required.

In one embodiment of the invention the platen may be fabricated from a lower refractive material such as Corning Eagle XG glass which has a refractive index of 1.5099. This material has the benefit of relatively low cost and will allow a sufficiently high TIR angle to enable salty water discrimination. Assuming the above indices for perspiration (salt water) of 1.34 and water of 1.33 the critical angle for salt water is 62.55777° and the critical angle for water of 61.74544°.

In one embodiment of the invention the indices of the SBG substrates and the element 42 are all chosen to be 1.65 and the platen index is chosen to be 1.5099. The material used in the low index layer 42 is equal in index to the SBG substrates, or slightly lower. The TIR angle in the SBG layer is 78 degrees. At this index value the diffracted beam angle with respect to the surface normal within the upper SBG substrate will be 55 degrees. For a TIR angle of 78 degrees in the SBG the effective diffraction bend angle is 23 degrees. The TIR angle in the platen based on the above prescription is 63.5 degrees allowing for typical refractive index tolerances (i.e. a 0.001 refractive index tolerance and 0.3-degree minimum margin for glass tolerances).

The above examples are for illustration only. The invention does not assume any particular optical material. However, the constraints imposed by the need for perspiration discrimination and the bend angles that can be achieved in practical gratings will tend to restrict the range of materials that can be used. Considerations of cost, reliability and suitability for fabrication using standard processes will further restrict the range of materials.

The required refraction angles in any layer of the sensors can be determined from the Snell invariant given by the formula n·sin (U)=constant where n is the refractive index and U is the refraction angle. Typically, the constant will be set by the value of the Snell invariant in the platen. For example, if the platen index is 1.5099 and the critical angle is 63.5° the Snell invariant is 1.5099×sin)(63.5°=1.351. The only exception to this rule will be the cases where diffraction occurs at elements of the SBG arrays or the transmission grating where the change in angle will defined by the respective grating prescriptions.

In the embodiment of FIG. 1 there is an air gap between the first SBG array 2 and the transmission grating. Other air gaps may be provided between other layers in the sensor architecture subject to the restrictions imposed by the Snell invariant and the diffraction bend angle as discussed above.

The invention requires tight control of refractive index and angle tolerances to maintain beam collimation otherwise cross talk between adjacent waveguides may occur leading to output signal ambiguities. Index variations: of 0.001 may lead to TIR boundaries shifting by around 0.25° for example. Angular tolerances are typically 0.1° in transmission. At reflection interfaces the angular error increases. In the worst case a ray will experience reflections off five different surfaces. Note that the TIR paths used in the sensor can typically undergo up to 18 bounces. The effects of a wedge angle in the substrates will be cumulative. For example, a 30 seconds of arc wedge may lead to a 0.3° error after 18 bounces. Desirably, the cumulative angular errors should allow a margin for TIR of at least 1°. Typical refractive indices and layer thicknesses used in the embodiment of FIG. 1 are provided in the table of FIG. 18.

Figure 12A:
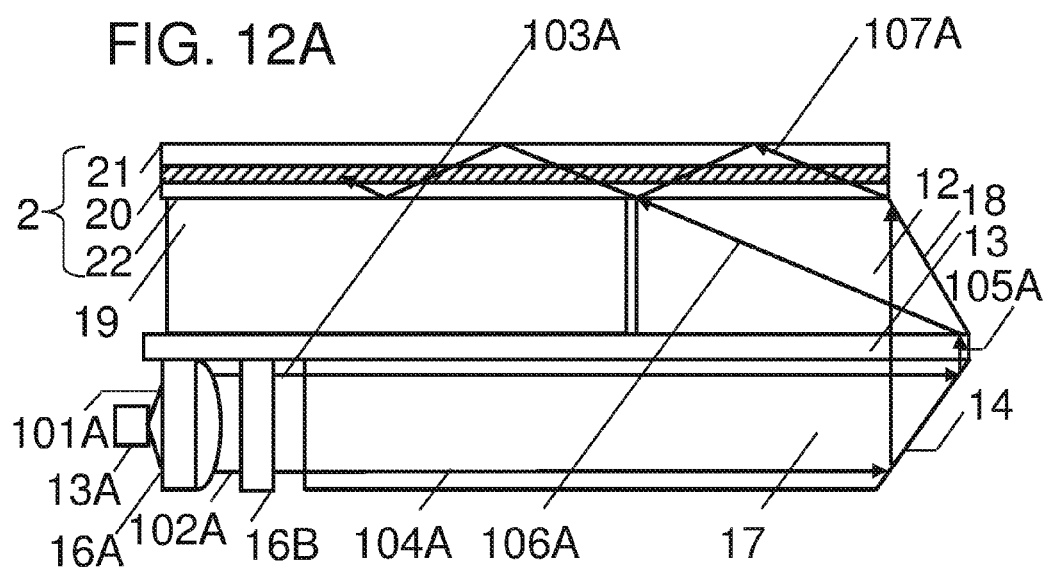
FIG. 12A is a schematic side elevation view of an illumination means in one embodiment of the invention.
Figure 12B:
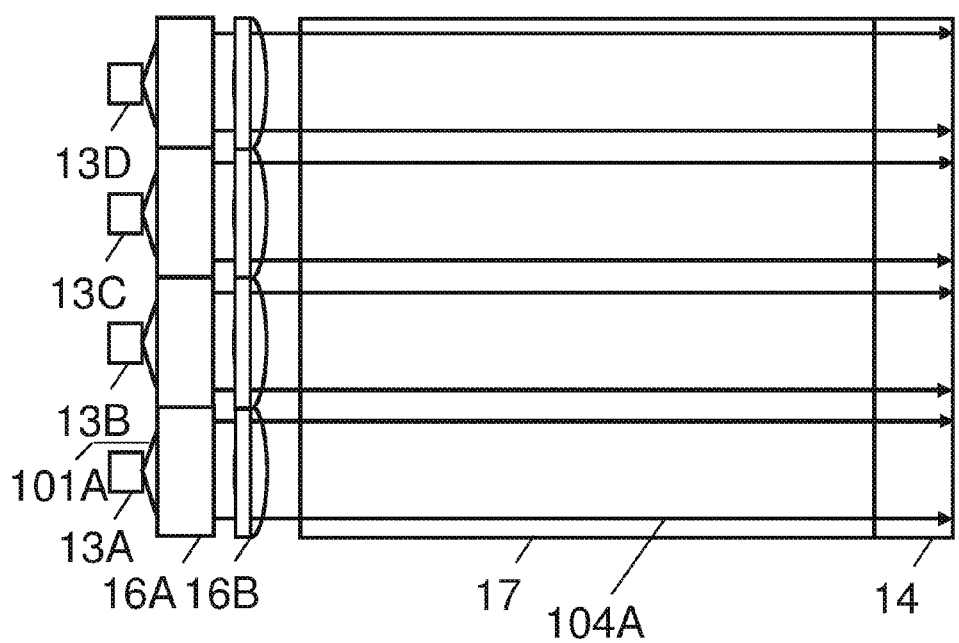
FIG. 12B is a schematic plan view of an illumination means in one embodiment of the invention.

FIG. 12 illustrates the illumination module of the contact image sensor in one embodiment in more detail. FIG. 12A is a schematic side elevation view showing the illumination means and the SBG device in one embodiment of the invention. FIG. 12B provides a side elevation view of the same embodiment of the invention. The wave guiding structure is not illustrated in FIG. 12A. The illumination means comprises a multiplicity of lasers indicated by 13A-13D providing separate parallel illumination modules, each module comprising a pair of crossed cylindrical lenses such as 16A,16B a light guide 17, transparent slabs 12,19 and transparent substrate 13. The slabs 12,19 abut the first SBG array 2 comprising the transparent substrates 21,22 sandwiching the SBG layer 20. In one embodiment the lenses 16A,16B may be crossed cylindrical lenses such that the first lens 16A collimates the input light 101A to provide a first beam 102A that is collimated in a first plane and the second lens 16B collimates the beam 102A in the orthogonal plane to provide a beam 103A collimated in a second plane orthogonal to the first plane such that the resulting beam in the light guiding element 17 is collimated in both beam planes. Advantageously, the lenses are of rectangular cross section. The beams from the lasers 13A-13D are identical and abut to form a continuous rectangular beam extending over an area substantially the same as the first SBG array in plan view. The light guide element 17 comprises a transparent slab with a planar input surface orthogonal to the beam direction and a reflecting surface 14 at an angle to the beam direction. The surface 14 reflects the beam 104A into the direction 105A orthogonal to 104A. Although the slab portions 12 and 19 are illustrated as being air separated they may abut. The slab 12 has a tilted reflecting surface 18 for directing light 106A into the SBG array device 2. In one embodiment of the invention the slab 12 has an identical refractive index to the substrates 21,22 sandwiching the SBG array 20. The slab 19 essentially performs the function of a spacer. The slab 13 also acts as spacer. In one embodiment of the invention the slab 13 is coated with a polarization selective coating in the region illuminated by the upward propagating light reflected off the mirror surface 14. The refractive index of the slab 19 is chosen to ensure that rays such as 106A,107A entering the first SBG array device exceed the critical angles for TIR within the light guide formed by the first SBG array device. The reflective surfaces 14,18 essentially provide the coupling means indicated schematically by the symbol 11 in FIG. 1 It should be apparent to those skilled in the art of optical design that in other embodiments of the invention other equivalent optical configurations including diffractive optical surfaces may be used to perform the function of the surfaces 14 and 18. Typically, the SBG array an average refractive index of 1.55 in its non-diffractive state and 1.62 when in a diffracting state. The substrates 21,22 have refractive indices of 1.55. The slab 12 has an index of typically between 1.5 and 1.7 to match the SBG substrates. The slab 19 is advantageously a polymer material of refractive index 1.49. The resulting critical angle in the first TIR light guide formed by the first array SBG device is therefore approximate 74 degrees.

Figure 13:
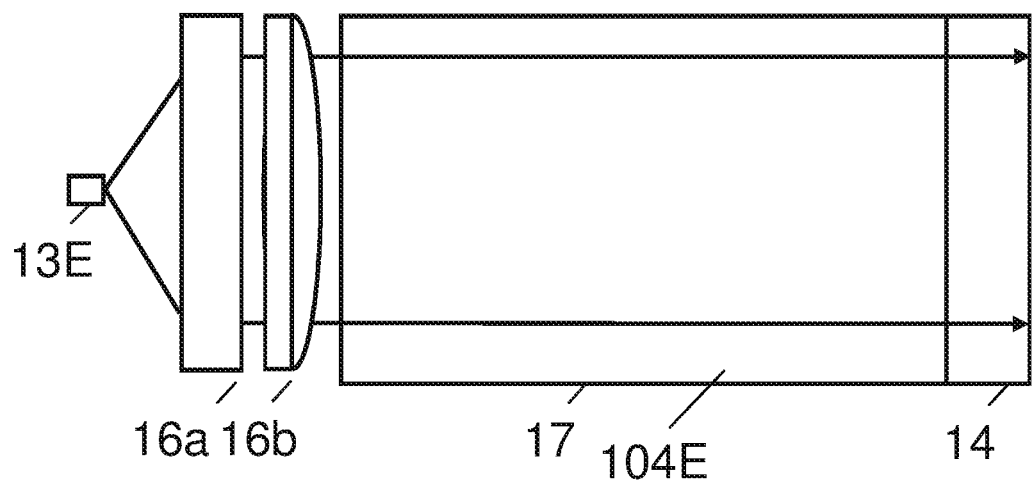
FIG. 13 is a schematic plan view of an illumination means in one embodiment of the invention.

In one embodiment illustrated in the schematic plan view of FIG. 13 the illumination means comprises a single laser 13E and a collimator lens system comprising the crossed cylindrical lenses 46a,46b. The said illumination means provides a single collimated beam of rectangular cross section 104E.

A sensor according to the principles of the present application may fabricated using the HPDLC material system and processes disclosed in PCT Application No.: PCT/GB2012/000680 entitled IMPROVEMENTS TO HOLOGRAPHIC POLYMER DISPERSED LIQUID CRYSTAL MATERIALS AND DEVICES which is incorporated by reference herein in its entirety. The SBG substrates may fabricated from polycarbonate, which is favored for its low birefringence. Two other currently available plastic substrates materials are a cyclic olefin copolymer (COC) manufactured by TOPAS Advanced Polymers and sold under the trade name TOPAS. The other was a cyclic olefin polymer (COP) manufactured by ZEON Corporation and sold under the trade names ZEONEX and ZEONOR. These materials combine excellent optical properties (including high transmission and low birefringence) with excellent physical properties (including low specific gravity, low moisture absorption, and relatively high glass transition temperature). The inventors have found that an adequate diffraction efficiency (i.e. ≥70%) can be obtained when using plastic substrates. The diffraction efficiency compares favorably with glass. The switching time of plastic SBG is also found to be sufficient to produce satisfactory devices.

Figure 14:
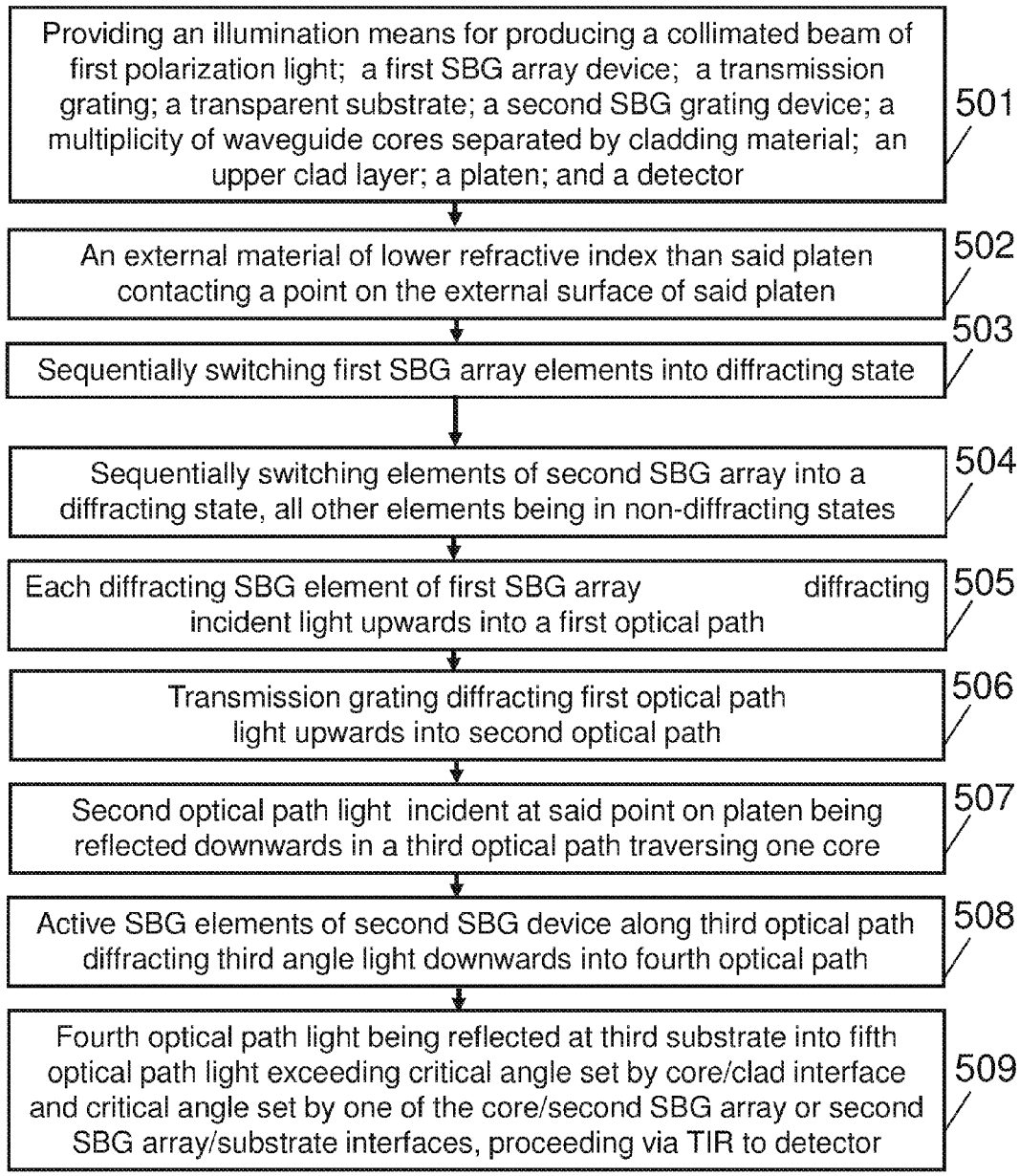
FIG. 14 is a flow chart illustrating a method of making a contact image measurement in one embodiment of the invention

Transparent conductive (ITO) coatings applied to the above plastics have been found to be entirely satisfactory, where satisfactory is defined in terms of resistivity, surface quality, and adhesion. Resistivity values were excellent, typically around 100 Ω/square. Surface quality (i.e., the size, number and distribution of defects) was also excellent. Observable defects are typically smaller than 1 micron in size, relatively few in number, and sparsely distributed. Such imperfections are known to have no impact on overall cell performance. ITO suffers from the problem of its lack of flexibility. Given the rugged conditions under some SBG devices may operate, it is desirable to use a flexible TCC with a plastic substrate. In addition, the growing cost of indium and the expense of the associated deposition process also raise concerns. Carbon nanotubes (CNTs), a relatively new transparent conductive coating, are one possible alternative to ITO. If deposited properly, CNTs are both robust and flexible. They can be applied much faster than ITO coatings, are easier to ablate without damaging the underlying plastic, and exhibit excellent adhesion. At a resistivity of 200 Ω/sq, the ITO coatings on TOPAS 5013S exhibit more than 90% transmission. At a resistivity of 230 Ω/sq, the CNT coatings deposited on the same substrates material exhibited more than 85% transmission. It is anticipated that better performance will results from improvements to the quality and processing of the CNTs An adhesion layer is required to support the transparent conductive coating. The inventors have found that the adhesion of ITO or CNT directly to plastics such as TOPAS and ZEONEX was poor to marginal. The inventors have found that this problem can be overcome by means of a suitable adhesion layer. One exemplary adhesion layer is Hermetic TEC 2000 Hard Coat from the Noxtat Company. This material has been found to yield a clear, mar-resistant film when applied to a suitably prepared plastic substrate. It can be applied by flow, dip, spin, or spray coating. TEC 2000 Hard Coat is designed to give good adhesion to many thermoplastic substrates that are cast, extruded, molded or blow molded. When applied to TOPAS, ZEONEX or other compatible plastics, the strength and break resistance provided by TEC 2000 is nearly as scratch and abrasion resistant as glass. Hermetic Hard Coat forms a transparent 3-6 micron thickness film on plastic surfaces. The Refractive index of the coating is 1.4902. A sample of TOPAS plastic sheet coated with TEC 2000 Noxtat protective Hard Coat is shown in FIG. 13. The next step in SBG cell production process is applying the TCC (ITO or CNT) to the hard coat. FIG. 14 shows Noxtat Hard Coat samples with additional ITO and CNT coatings. The Hard Coat plays two roles in SBG cell production. One is to increase adhesion of the conductive layer to the plastic and prevent degassing during vacuum coating. The second role is to seal the plastic surface from environmental influence. It was found that TEC 2000 Hard Coat performs very well with TOPAS and ZEONEX materials.

A fundamental feature of SBGs fabricated using current HPDLC material systems is that the grating is present when the device is in its passive state. An electric field must be applied across the HPDLC layer to clear the grating. An alternative HPDLC material system that may be used with the present invention provides a reverse mode SBG in which the grating is clear when in its passive state. A reverse mode SBG will provide lower power consumption. Reverse mode SBG devices are disclosed in PCT Application No.: PCT/GB2012/000680.

A method of a method of making a contact image measurement in one embodiment of the invention in accordance with the basic principles of the invention is shown in the flow diagram in FIG. 14. Referring to the flow diagram, we see that the said method comprises the following steps:

At step 501 providing an apparatus comprising the following parallel optical layers configured as a stack: an illumination means for providing a collimated beam of first polarization light; a first SBG array device further comprising first and second transparent substrates sandwiching an array of selectively switchable SBG column elements, and ITO electrodes applied to opposing faces of the substrates and the SBG substrates together providing a first TIR light guide for transmitting light in a first beam direction; an air gap; a transmission grating; a third transparent substrate (low index glue layer); a SBG cover glass; a ITO layer; a second SBG array device comprising array of selectively switchable SBG column elements; a ITO layer; a barrier film; a waveguiding layer comprising a multiplicity of waveguide cores separated by cladding material having a generally lower refractive index than the cores, the cores being disposed parallel to the first beam direction; an upper clad layer having a generally lower refractive index than the cores (also referred to as the bottom buffer); a priming layer; a platen; and further comprising: means for coupling light from the illumination means into the first TIR light guide; means for coupling light out of the waveguide into an output optical path; and a detector comprising at least one photosensitive element, wherein ITO electrodes are applied to the opposing faces of the substrate and the waveguide core;

At step 502 an external material contacting a point on the external surface of the platen;

At step 502 sequentially switching elements of the first SBG array into a diffracting state, all other elements being in their non-diffracting states;

At step 503 sequentially switching elements of the second SBG array into a diffracting state, all other elements being in their non-diffracting states;

At step 504 each diffracting SBG element of the first SBG array diffracting incident first TIR light upwards into a first optical path, At step 505 the transmission grating diffracting the first optical path light upwards into a second optical path, At step 506 a portion of the second optical path light incident at the point on the platen being transmitted out of the platen and light incident on the outer surface of the platen in the absence of said contact with an external material being reflected downwards in a third optical path, said third optical path traversing said cores, At step 507 a portion of the second light path incident at the point on the platen being reflected downwards in a third optical path traversing one core.

At step 508 an active SBG element of the second SBG array along the third optical path diffracting the third angle light downwards into a fourth optical path, At step 509 the fourth optical path light being reflected upwards into a fifth optical path at the third substrate, the fifth optical path light exceeding the critical angle set by the core/clad interface and the critical angle set by one of the core/second SBG array or second SBG array/third substrate interfaces, and proceeding along a TIR path to the detector.

In one embodiment of the invention the first to fifth optical paths in the method of FIG. 14 lie in a plane orthogonal to the first SBG array.

In one embodiment of the invention the method of FIG. 14 further comprises the step of providing a transparent slab of index lower than the third transparent substrate disposed between the third substrate and the transmission grating, such that the fourth optical path light is reflected upwards at the substrate into a fifth optical path and the fifth optical path light exceeds the critical angle set by the core/clad interface and the critical angle set by one of the core/second SBG array, second SBG array/third substrate or third substrate/slab interfaces, providing a TIR path to the detector.

Figure 15:
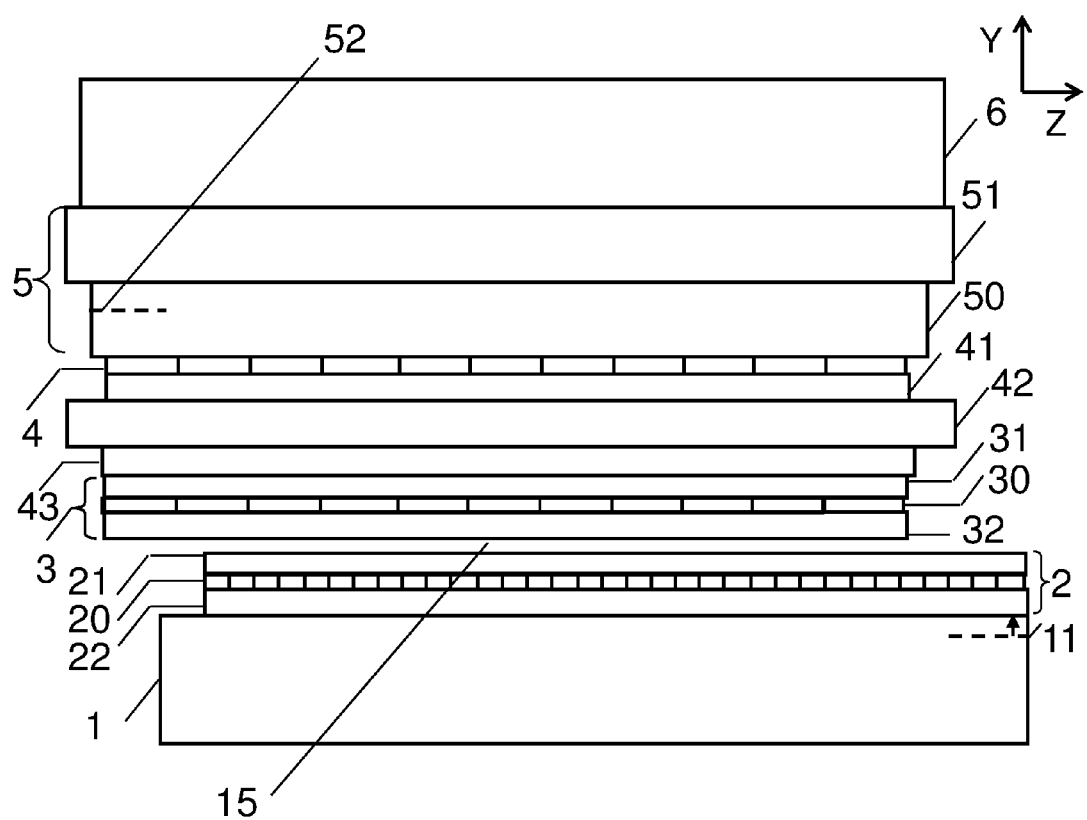
FIG. 15 is a schematic side elevation view of a contact image sensor in one embodiment of the invention.

A contact image sensor according to the principles of the invention is illustrated in the schematic side elevation view of FIG. 15. The apparatus is identical to that of FIG. 1 but further comprises a half wave retarder array 3 disposed between the air gap 15 and the transmission grating 43. The half wave retarder array 3 comprises an array of column-shaped elements 30 sandwiched by transparent substrates 31,32. Each retarder element in the half wave retarder array is switchable between a polarization rotating state in which it rotates the polarization of incident light through ninety degrees and a non-polarization rotating state.

The column elements of the half wave retarder array have longer dimensions disposed parallel to the Y-axis i.e. orthogonally to the first TIR beam direction. Each half wave retarder array element overlaps at least one strip element of the first SBG array. At any time one element of the first SBG array is in a diffracting state and is overlapped by an element of the half wave retarder array in its non-polarization rotating state, one element of the second SBG array is in a diffracting state, all other elements of the first and second SBG arrays are in a non-diffracting state and all other elements of the half wave retarder array are in their polarization rotating states.

Figure 16:
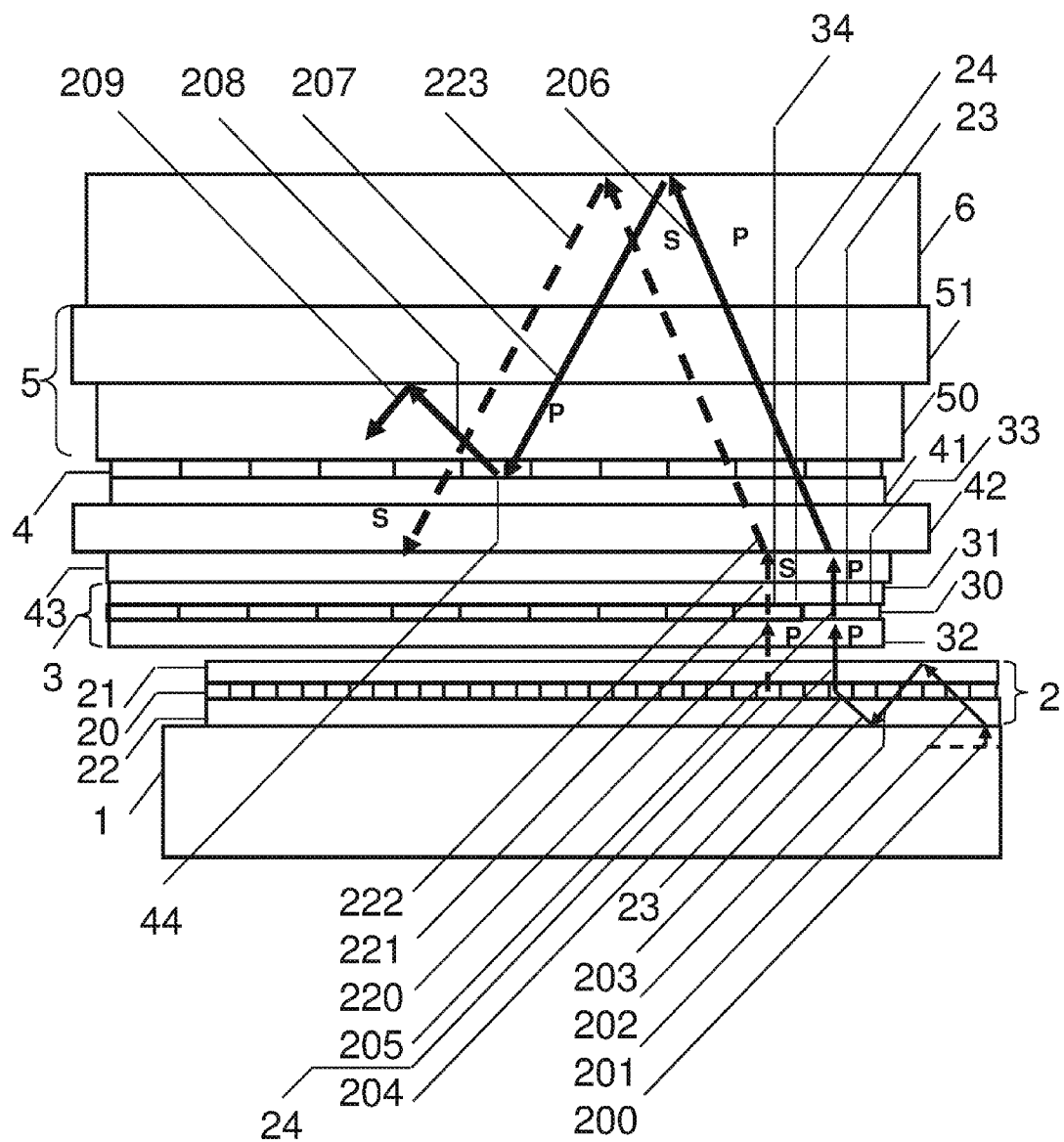
FIG. 16 is a schematic side elevation view of a contact image sensor in one embodiment of the invention showing the principle ray paths.

Turning now to FIG. 16 the function of the half wave retarder array is to control stray light such as that indicated by the ray 220 which is diffracted by the residual refractive index modulation of the element 24. The switchable half wave retarder array solves the problem of background leakage noise by converting unwanted light at source into S-polarized light. The active (i.e. diffracting) SBG column element 23 diffracts light 204 out of the light guide through the element 33 of the half wave retarder array 30 array as light 205. Since the element 33 is in its non-polarization rotating state the light 205 remains P-polarized. Note that all other elements of the half wave retarder array are in their polarization rotating states. The diffracted ray 220 is transmitted through the half wave retarder element 34 which is in its polarization rotating state such that the P-polarized light 220 is converted into S-polarized light 221. The ray 221 is next diffracted into the ray 222 by the transmission grating 43. The ray 223 is reflected off the platen/air interface into a downwards path as the ray 223. Since the ray 223 is S-polarized it is not diffracted by the second SBG and is therefore not coupled into the waveguide path to the detector. In one embodiment of the invention the light 223 propagates downwards though the stack of optical layers until it emerges from the bottom of the illuminator means 1 and is absorbed by a light-trapping means which is not illustrated. Typically, the light-trapping means would be an absorber. Other means for disposing of light of the type represented by the ray 223 will be apparent to those skilled in the art of optical design. The invention does not assume any particular means for disposing of such stray light.

Figure 17:
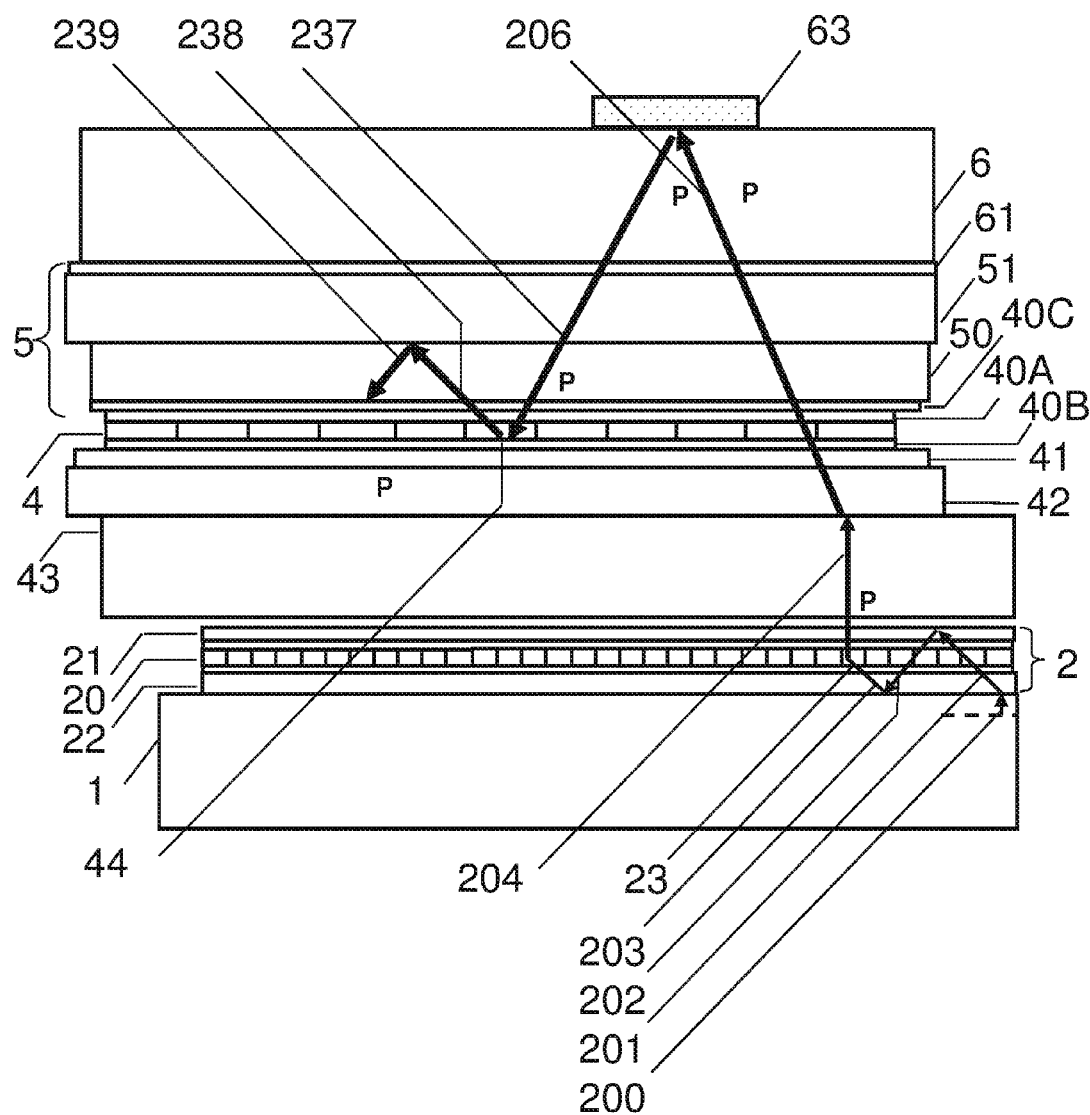
FIG. 17 is a schematic side elevation view of a contact image sensor in one embodiment of the invention.

In one embodiment of the invention illustrated in FIG. 17 there is provided a means for contact imaging of an object that emits light of a second wavelength when illuminated by light of a first wavelength. The apparatus of FIG. 17 is identical to the sensor FIG. 4 except that in FIG. 15 the rays 237,238,239 which replace the rays 207,208,209 of FIG. 4 now correspond to second wavelength light emitted from the object 63 which is in contact with the platen and illuminated by first wavelength light 206. In one embodiment of the invention the object 63 may be a fluorescent material excited by UV radiation. The ray 243 which replaces the ray 223 of FIG. 4 again represents a stray light path. It should be noted that the embodiment of FIG. 17 will required a more intense light source to compensate for the low coupling efficiency of the second wavelength light into the detector waveguide. The reason for this is that the light emitted from the object 61 will tend to be diffuse and unpolarized (in contrast to the situation in FIG. 4 where the downgrade light from the platen will be collimated and will retain the incident light polarization and collimation).

FIG. 18 is a table of the optical prescriptions of each layer (refractive index at 785 nm. and layer thickness in microns) of a typical implementation of the embodiment of FIG. 1. Each layer is reference by the numerals used in FIG. 1. As should be apparent to those skilled in the art many other combinations of layer materials and thickness may be used.

Figure 19:
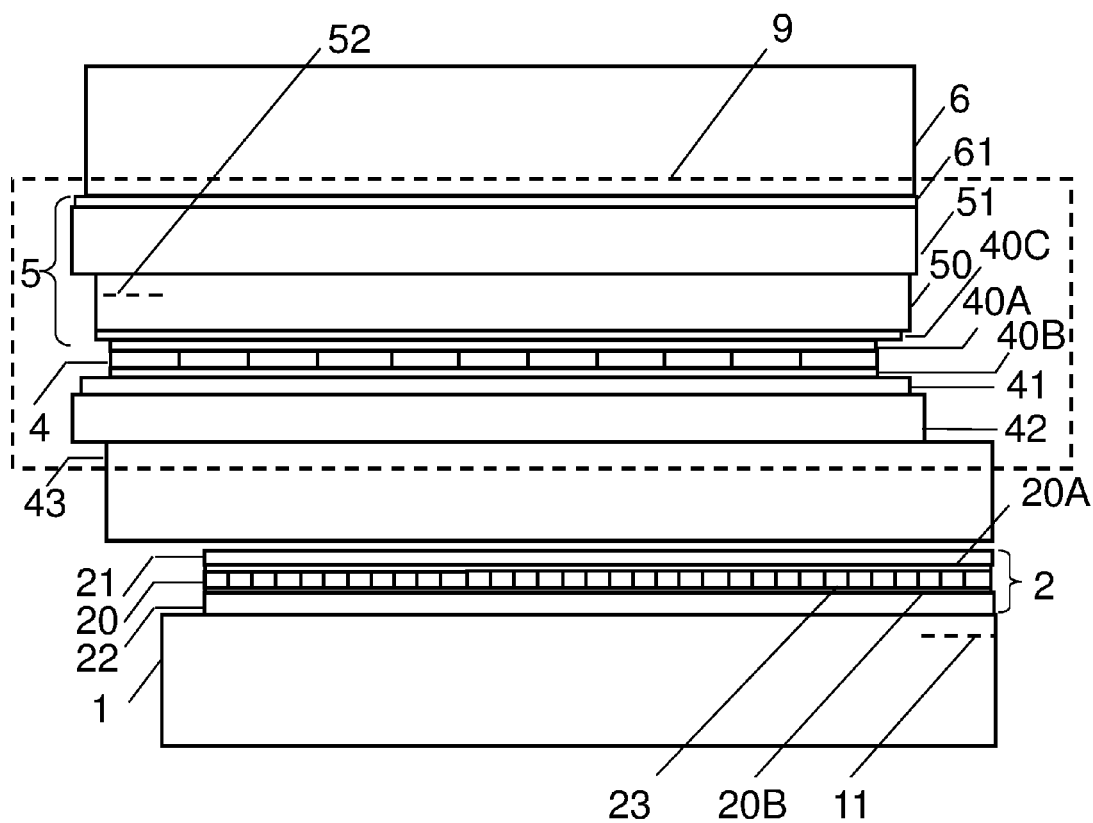
FIG. 19 is a schematic side elevation view of a contact image sensor in one embodiment of the invention.
Figure 20:
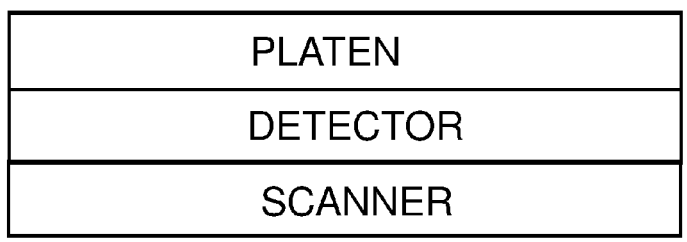
FIG. 20 is a schematic diagram showing the key components a contact image sensor in one embodiment of the invention.

In the above described embodiments the contact sensor essentially comprises three modules: a scanner a detector and the platen. These components are illustrated in FIGS. 19-20 in which FIG. 19 is essentially FIG. 1 with the components comprising the detector layer 9 (that is the second SBG array 4 and the waveguiding 5) contained in a dashed line box. The platen comprises the illuminator module and the first SBG array device 2. We now consider an embodiment of the invention that combines the functions of the second SBG array 4 and the waveguiding 5 (that is, the detector module as defined above) in a single SBG array device. This alternative detector module will be now discussed with reference to FIGS. 21-26.

As already discussed the contact sensor comprises the following parallel optical layers configured as a stack: an illumination means for providing a collimated beam of first polarization light; a first SBG array device further comprising first and second transparent substrates sandwiching an array of selectively switchable SBG column, and transparent electrodes applied to opposing faces of the SBG substrates together providing a first TIR light guide for transmitting light in a first TIR beam direction; and a transmission grating; and a platen, as illustrated in FIG. 1 but not shown in FIGS. 21-26.

Figure 21:
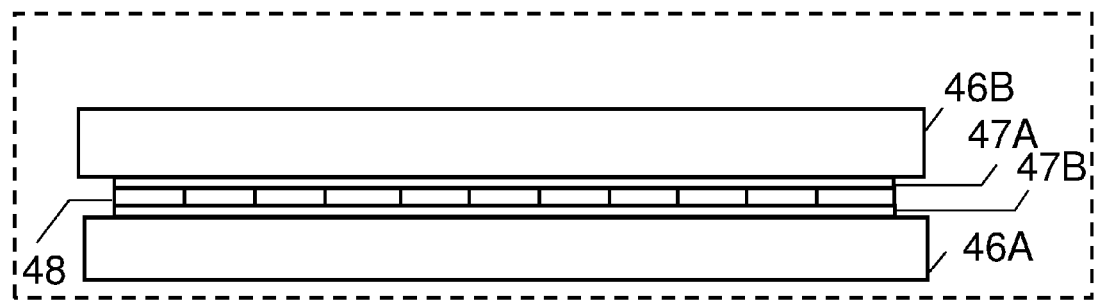
FIG. 21 is a schematic side elevation view of a detector waveguide in one embodiment of the invention.
Figure 22:
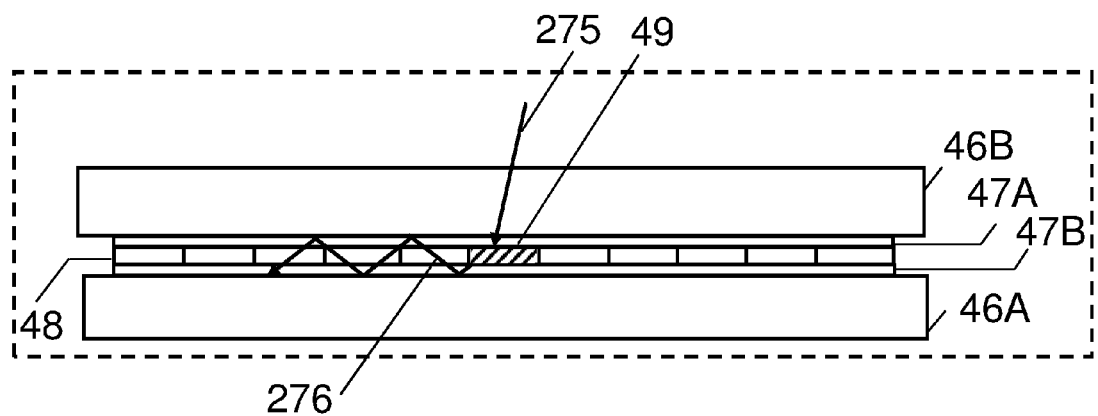
FIG. 22 is a schematic side elevation view of a detector waveguide in one embodiment of the invention showing the coupling of signal light via an active element of the SBHG array.
Figure 23:
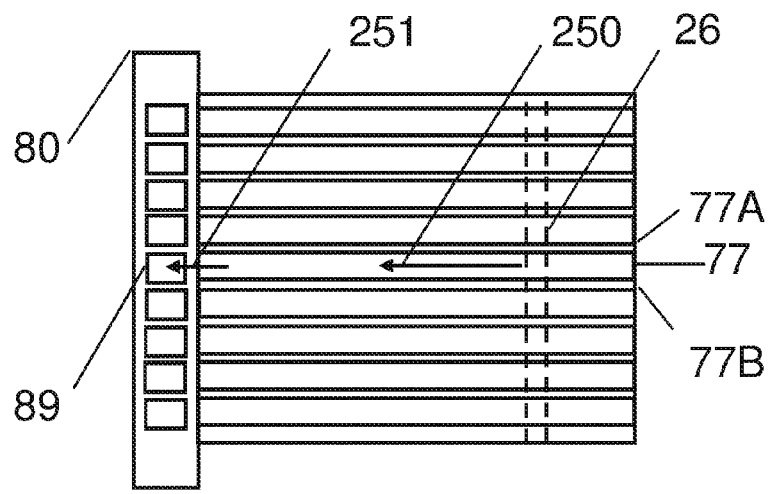
FIG. 23 is a schematic plan view of a wave-guiding structure and detector module used in one embodiment of the invention.
Figure 24:
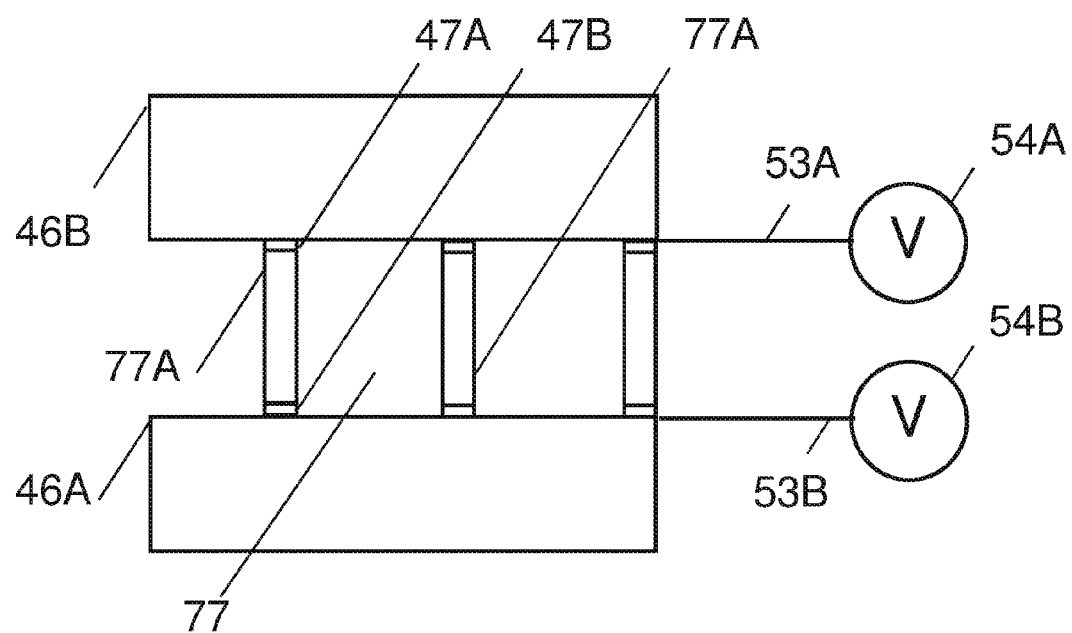
FIG. 24 is a cross-sectional view showing a detail of a detector component using a SBG waveguiding structure in one embodiment of the invention.
Figure 25:
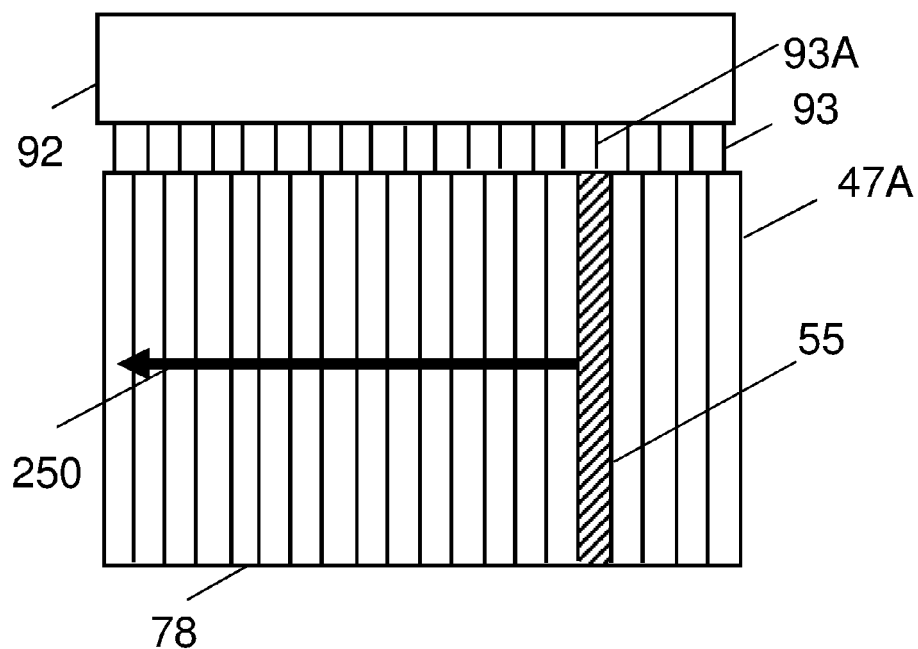
FIG. 25 is a plan view of the SBG switching electrodes used in one layer of a detector component based a SBG waveguiding structure in one embodiment of the invention.
Figure 26:
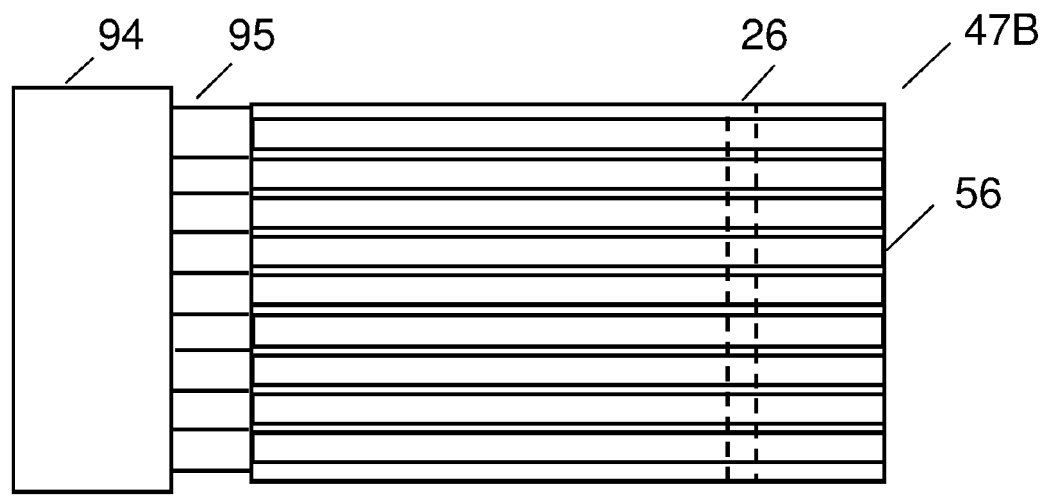
FIG. 26 is a plan view of the SBG switching electrodes used in one layer of a detector component based a SBG waveguiding structure in one embodiment of the invention.

The second SBG array device, which is shown in FIG. 21, comprises third and fourth transparent substrates 46A,46B sandwiching the SBG layer which is generally indicated by 48. The SBG layer essentially consists of a multiplicity of high index HPDLC regions separated by low index HPDLC regions. Patterned transparent electrodes 47A,47B are applied to opposing faces of the substrates. FIG. 22 shows the apparatus of FIG. 21 in its active state, that is with voltages applied to the electrodes sandwiching one SBG region 49. FIG. 23 shows a plan view of the second SBG array device. The SBG layer comprises alternating low index regions and high index regions which together provide a waveguide structure. The high index regions provide waveguiding cores disposed parallel to the first beam direction generally indicated by 250. The low index HPDLC regions provide waveguide cladding FIG. 23 shows a waveguide core 77 provided by a high index region and adjoining cladding regions 77A,77B provided by low index regions. A ray path from one core to a photosensitive element 89 of the detector array 80 is indicated by 251. The waveguide structure is shown in cross section in FIG. 24 which also shows electrodes 47A, 47B across a cladding region 77A. The adjacent core region is indicated by 77. Anti-phase voltages V1, V2 are applied to the upper and lower electrodes via connections 53A, 53B using the anti-phase voltage generators 54A,54B. The third and fourth substrate layers 46A, 46B have a generally lower refractive index than the cores and will typically match the indices of the cladding regions. FIG. 25 shows the SBG switching electronics 92 and a set of electrical connections 93 for addressing the electrode array with column-shaped elements orthogonal to the waveguides, that is orthogonal to the beam propagation direction 250. The addressing of one particular electrode 55 by the electrical connection 93A is indicated. FIG. 26 shows the SBG switching electronics 94 and a set of electrical connections 95 for addressing the electrode array with elements running parallel to the waveguides. The patterned electrodes applied to the third substrate such as 55 define a multiplicity of selectively switchable columns of SBG elements such as the one indicated by 26 which are aligned orthogonally to the waveguiding cores shown in FIG. 26. The patterned electrodes applied to the fourth substrate comprise elongate elements such as 56 overlapping the low index HPDLC regions.

As in the embodiment of FIG. 1 the apparatus further comprises: means for coupling light from the illumination means into the first TIR light guide; means for coupling light out of the second SBG array device into an output optical path; and a detector 80 comprising at least one photosensitive element 89 in FIG. 23. The detector comprises an array of photosensitive elements, each photosensitive element being optically coupled to at least one waveguiding core. Each SBG element in the first and second SBG arrays is switchable between a diffracting state and a non-diffracting state with the SBG elements diffracting only first polarization light.

In one embodiment of the invention based on an SBG waveguiding structure the SBGs operate in reverse mode such that the diffracting state exists when an electric field is applied across the SBG element and a non-diffracting state exists when no electric field is applied. Alternatively, the SBGs may operate in forward mode, that is the diffracting state exists when no electric field is applied across the SBG element and a non-diffracting states exists when an electric field is applied. At any time one element of the first SBG array is in a diffracting state, one element of the second SBG array is in a diffracting state, all other elements of the first and second are in a non-diffracting state. An air gap may be provided between first SBG array and the transmission grating. Alternatively, a low refractive index material may be used for this purpose.

In one embodiment based on an SBG waveguiding structure discussed above an active SBG element of the first SBG array in a diffracting state diffracts incident first TIR light upwards into a first beam direction. Referring to FIG. 22, light incident on the outer surface of the platen in the absence of external material is reflected downwards in a third optical path 275. The third optical path traverses the cores. An active column 49 of the second SBG array along the third beam direction diffracts the third angle light into a second TIR path 276 down the traversed core towards the detector. The first to third optical paths and the first and second TIR paths are in a common plane.

In one embodiment based on an SBG waveguiding structure the output from detector array element is read out in synchronism with the switching of the elements of the first SBG array.

In one embodiment based on an SBG waveguiding structure there is provided a method of making a contact image measurement comprising the steps of:
a) providing an apparatus comprising the following parallel optical layers configured as a stack: an illumination means for providing a collimated beam of first polarization light; a first SBG array device further comprising first and second transparent substrates sandwiching an array of selectively switchable SBG column elements, and transparent electrodes applied to opposing faces of the substrates and the SBG substrates together providing a first TIR light guide for transmitting light in a first beam direction; a transmission grating; a transparent substrate; a second SBG array device further comprising third and fourth substrates sandwiching a multiplicity of high index HPDLC regions separated by low index HPDLC regions and patterned transparent electrodes applied to opposing faces of the substrates; a platen; and a detector; and further comprising: means for coupling light from the illumination means the first TIR light guide; means for coupling light out of the second SBG array device into an output optical path; and a detector comprising at least one photosensitive element; the high index regions providing waveguiding cores disposed parallel to the first beam direction and the low index HPDLC regions providing waveguide cladding; the substrates layers having a generally lower refractive index than the cores, the patterned electrodes applied to the third substrate defining a multiplicity of selectively switchable columns orthogonal to the waveguiding cores and the patterned electrodes applied to the fourth substrate overlapping the low index HPDLC regions;
b) an external material contacting a point on the external surface of the platen;
c) sequentially switching elements of the first SBG array into a diffracting state, all other elements being in their non-diffracting states;
d) sequentially switching columns of the second SBG array device into a diffracting state, all other columns being in their non-diffracting states;
e) each diffracting SBG element of the first SBG array diffracting incident first TIR light upwards into a first optical path,
f) the transmission grating diffracting the first optical path light upwards into a second optical path,
g) a portion of the second optical path light incident at the point on the platen contacted by the external material being transmitted out of the platen, while portions of said second optical path light not incident at the point are reflected downwards in a third optical path, the third optical path traversing one core,
h) an active SBG column element of the second SBG array along the third optical path diffracting the third angle light in a second TIR path down the traversed core and proceeding along a TIR path along the core to the detector.

Figure 27:
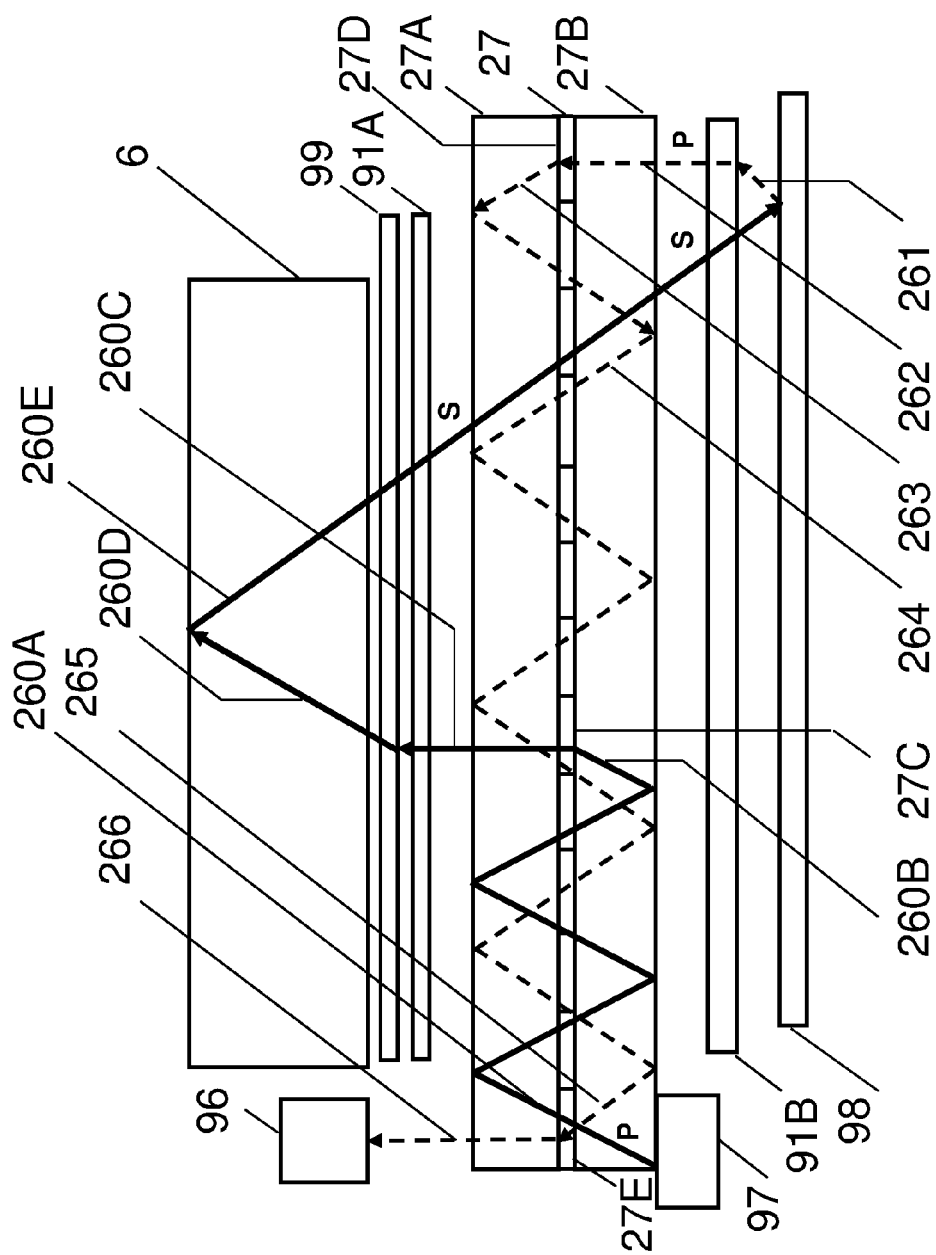
FIG. 27 is a side elevation view of a contact image sensor in one embodiment of the invention in which the detector and illuminator components are performed by a single waveguide containing a single SBG array.

In one embodiment of the invention which is illustrated in the schematic side elevation view of FIG. 27 there is provided a contact image sensor using a single SBG array layer comprising: an illumination means 97 for providing a collimated beam of first polarization light; an SBG array device further comprising first and second transparent substrates 27A,27B sandwiching an array of selectively switchable SBG columns 27, and transparent electrodes (not shown) applied to opposing faces of the substrates, said SBG substrates together providing a first TIR light guide for transmitting light in a first TIR beam direction; a first transmission grating layer 91B overlaying the lower substrate of the SBG array device; a second transmission grating layer 91A overlaying the upper substrates of the SBG array device; a quarter wavelength retarder layer 99 overlaying the second transmission grating layer; a platen 6 overlaying the quarter wavelength retarder layer; and a polarization rotating reflecting layer 98 overlaying the first transmission grating layer. The apparatus further comprises: means for coupling light from said illumination means into said SBG array device (which is not illustrated); means 27E for coupling light out of the second SBG array device into an output optical path; and a detector 96 comprising at least one photosensitive element. The illumination coupling means is typically a grating or prism as discussed earlier. The light path from the illumination means (ray 260A) to the platen via a diffracting SBG column 27C (ray 260B up the SBG column, ray 260C up to the transmission grating layer 91A and ray 260D through the quarter wave plate 99) and the reflected ray path through each of the between the upper surface of the platen and the polarization rotating reflection layer 98 is illustrated by the solid line. The path of the reflected light from the polarization rotating reflection layer to the detector means which comprises diffraction upwards towards the platen by the transmission grating 91B (ray 261), coupling into the SBG array waveguide by the active SBG column 27D (ray 262), propagation along a TIR path (rays 263,264), interaction with the out-coupling grating 27E (ray 265) and propagation towards the detector 96 (ray 266) is shown as a dashed line.

Figure 28A:
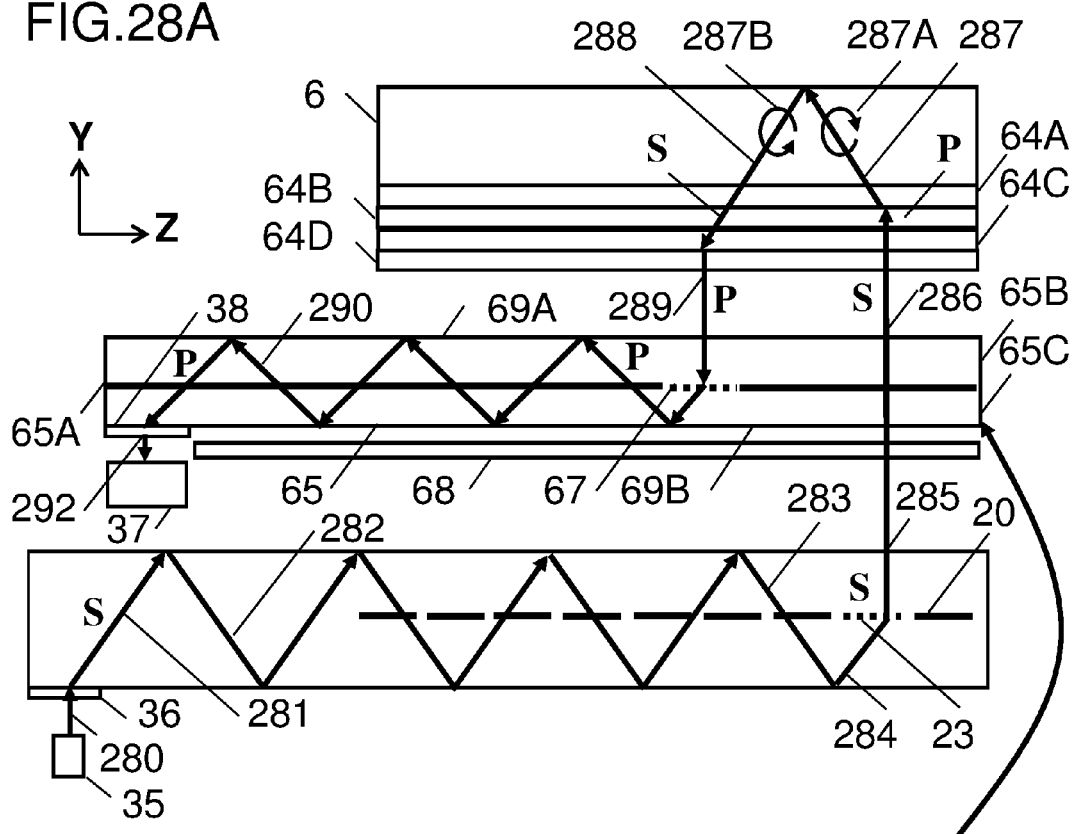
FIG. 28A is a side elevation view of a contact image sensor in one embodiment of the invention in which external surfaces of the detector waveguide are divided into interspersed grids of strips having different light-modifying characteristics to provide a multiplicity of parallel waveguiding paths.

We next discuss a further embodiment of the invention directed at further simplification of the detector component. The contact sensor architecture which is shown in detail in FIG. 28 retains the key functional elements of scanner detector and platen discussed above. As in the case of the SBG waveguide embodiment discussed above the aim is to eliminate the design complexity and cost of the polymer waveguide used in the earlier embodiments. In the embodiment of FIG. 28 the waveguides are formed by means of passive surface coatings which confine the collimated light reflected from the platen to parallel waveguide-like paths leading to the detector.

In the embodiment of FIG. 28 a contact image sensor comprises: an illumination means for providing a collimated beam of first polarization light; an illuminator waveguide for propagating light in a first TIR path containing a first array of switchable grating columns; a detector waveguide for propagating light in a second TIR path containing a second array of switchable grating columns; a beam steering means comprising at least one grating disposed between the platen and the detector waveguide; a first waveguide coupler for coupling light from the illumination means into the illuminator waveguide; a second waveguide coupler for coupling light out of the detector waveguide into an output optical path; a detector comprising at least one photosensitive element; and a platen. Each switchable grating element in the first and second switchable grating arrays is switchable between a diffracting state and a non-diffracting state. The switchable grating elements diffract only the first polarization light. Each external surface of the detector waveguide is divided into a first grid of strips interspersed with a second grid of strips. The first and second grids have different light-modifying characteristics. Overlapping strips from the first grid of strips on each external surface are operative to waveguide light. Overlapping strips from the second grid of strips on each external surface are operative to absorb light scattered out of regions of the detector waveguide sandwiched by overlapping strips from the first grid of strips on each external surface. The strips are orthogonal to the switchable grating columns. The first grid of each external waveguide surface is one of clear or scattering and the second grid of at least one external waveguide surface is infrared absorbing. The beam steering means comprises: a first transmission grating layer; a half wavelength retarder layer overlaying the first transmission grating layer; a second transmission grating layer overlaying the half wavelength retarder layer; and a quarter wavelength retarder layer sandwiched by the second transmission grating layer and the platen.

Turning again to FIG. 28 we see that, as in the earlier embodiments, the scanner is an active SBG column array 20 which directs sheets of collimated integrated leaser light upwards the transparent detector layer into the plate by switching the column elements in scrolling fashion. Typically, the scanning grating comprises 1600 48.8 micron wide ITO electrodes etched onto a glass substrate with a 50.8-micron pitch (that is, 500 electrodes per inch). The laser source 35 emits collimated light 280 which is coupled into the scanner waveguide by a grating coupler 36 into to the TIR path represented by rays 281-284. When a potential is applied across one of the transparent electrodes such as 23, light is diffracted out of the scanner waveguide into a direction such as 285 (typically normal the waveguide substrate. When the voltage is removed, diffraction ceases and the light continues to be totally internally reflected between the scanner substrates. Note that the TIR light in the scanner is labelled as a being S-polarized (using S-polarization-sensitive SBGs). In an alternative embodiment the scanner may use conventional P-polarization-sensitive SBGs with a HWF layer being provided adjacent the scanner to rotate the out-coupled P-polarized light to S. As will be explained below S-polarized output light is required to avoid interaction with the SBGs in the detector layer.

As in the earlier embodiments the first and second TIR paths are parallel to each other the switchable grating columns are preferentially orthogonal to the TIR paths. The first and second switchable grating arrays are switched in cyclic fashion with only one the column element in each array being in a diffracting state at any time. The illuminator and detector waveguides each comprise first and second transparent substrates sandwiching an array of switchable grating columns, and transparent electrodes applied to opposing faces of the substrates. The switchable grating is one of a forward mode SBG, a reverse mode SBG, or a stack of thin switchable gratings. For conventional forward mode SBGs the diffracting state exists when no electric field is applied across the switchable grating element and the non-diffracting states exists when an electric field is applied. This situation is reversed for reverse mode SBGs. At any time one element of the first switchable grating array is in a diffracting state, one element of the second switchable grating array is in a diffracting state, all other elements of the first and second switchable grating arrays are in a non-diffracting state. The output from detector array element is read out in synchronism with the switching of the elements of the first switchable grating array.

As in the earlier embodiments, the scanned light needs to be directed onto the platen 6 at a preferred angle. This ensures a clear image capture that is tolerant to the enrollee's hand and finger moisture. This is accomplished by passive tilt gratings 64B,64D one (64B) for the upward beam 286 and a reversed version (64D) for the downward reflected light. The tilt gratings are essentially passive transmission grating recorded in holographic polymer film such as the material manufactured by Bayer Inc. The apparatus further comprises a Quarter Wave Film (QWF) 64A which is sandwiched by the upward beam tilt grating and the platen and a Half Wave Film 64C which is sandwiched by the downward and the upward beam tilt grating. Upward-going S-polarized light from the illuminator waveguide is first converted into P polarize light by the HWF and then into first sense circularly polarized light by the QWF 287. On reflection from the platen the sense of the circular polarized light is reversed as indicated by the symbols 287A, 287B so that P polarized light 289 is produced after the second pass (downward-going) through the QWF and the HWF. The tilt grating 64D diffracts this light normal to the detector layer in the direction 289.

During a scan, the user's four fingers are placed onto the platen surface. Wherever the skin touches the platen, it "frustrates" the reflection process, causing light to leak out of the platen. Thus, the parts of the skin that touch the platen surface reflect very little light, forming dark pixels in the fingerprint image. The image is built up line by line into a 500 dpi, FBI-approved industry standard picture ready for comparison checking.

The detector 65 comprises an SBG column array 65A similar to the scanner array sandwiched by substrates 65B, 65C. Electrodes (not illustrated) are applied to the opposing surfaces of the substrate with at least one being pattern with ITO columns overlaying the SBG column elements. An out-coupling grating 38 (or other equivalent optical means such as prism) out-couples light 292 from the detector waveguide towards a detector array 37. The TIR path in the waveguide from an active SBG column element 67 to the out-coupling grating 38 is represented by 290.

The detector and scanner waveguides may be air separated. Alternative they may be sandwich a low index material layer which is schematically indicated by the thin layer 68. Since the scanner waveguide is transparent the out coupled light from the detector waveguide may in an alternative embodiment be transmitted through the detector layer onto a detector array which is disposed alongside the laser source. Other implementations that will result in further compression of the sensor form factor should be apparent to those skilled in the art.

As shown in FIG. 28 the illumination traverses the detector waveguide on its way to the platen. In another embodiment of the invention the illuminator waveguide may be disposed between the detector waveguide and the platen (and beam steering gratings) such that light reflection from the platen traverses the illuminator waveguide on its way to the detector waveguide. As illustrated in FIG. 28 the ray directions from the source to the detector lie in a common plane.

Each external surface of the detector waveguide is divided into a first grid of strips interspersed with a second grid of strips. The first and second grids have different light-modifying characteristics. Overlapping strips from the first grid of strips on each external surface are operative to confine light to a waveguide path. Overlapping strips from the second grid of strips on each external surface are operative to absorb light scattered out of regions of the detector waveguide sandwiched by overlapping strips from the first grid of strips on each external surface. The strips are orthogonal to the switchable grating columns. The first grid of each external waveguide surface is one of clear or scattering and the second grid of at least one external waveguide surface is infrared absorbing. Essentially, three types of surface strip are required: clear, scattering and light (infrared) absorbing. Typically, the scattering properties will be provided by frosting the surface or applying some computer generated surface relief structure using an etching process. Other methods of providing controlled scatter using diffractive surface structures may also be used. The stripes define parallel propagation channels terminating at the linear detector array. Typically, the channel widths are 40 microns with gaps of 12 micron give a pitch of 52 microns (equivalent to 500 dpi).

Figures 28B, 28C, 28D:
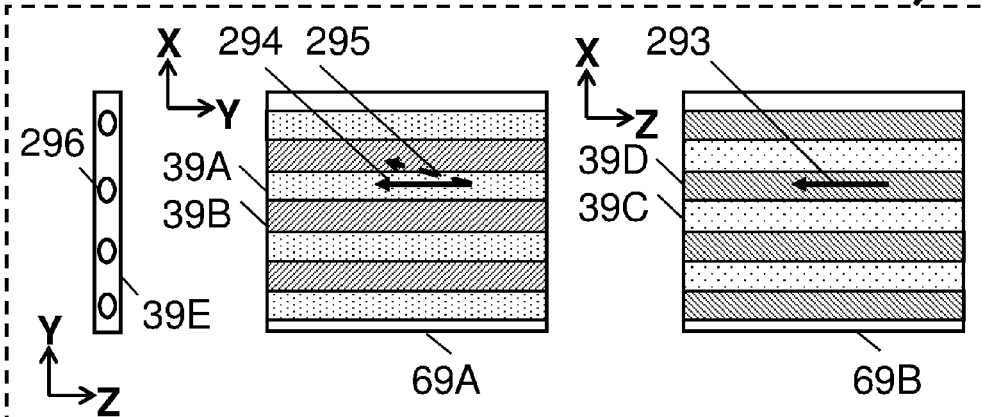
FIG. 28B is a detail of the embodiment of FIG. 28A showing the interspersed grid of strips on a first external surface.
FIG. 28C is a detail of the embodiment of FIG. 28A showing the interspersed grid of strips on a first external surface.
FIG. 28D is a detail of the embodiment of FIG. 28A showing a cross section of the detector waveguide with beam cross sections.
Figure 29:
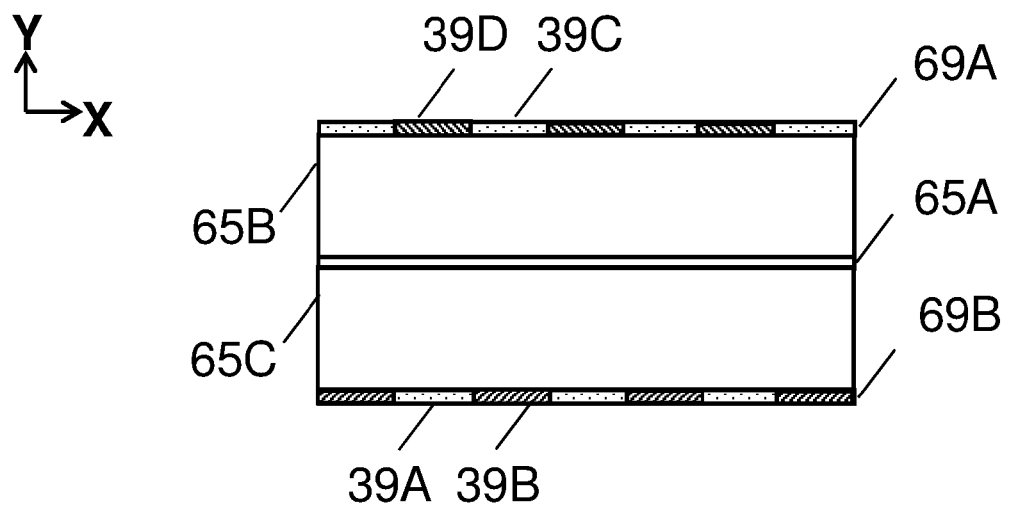
FIG. 29 is a side elevation view of the detector waveguide in the embodiment of FIG. 28A showing a side view of the SBG array and the interspersed grids of strips applied to the external surface.
Figure 30:
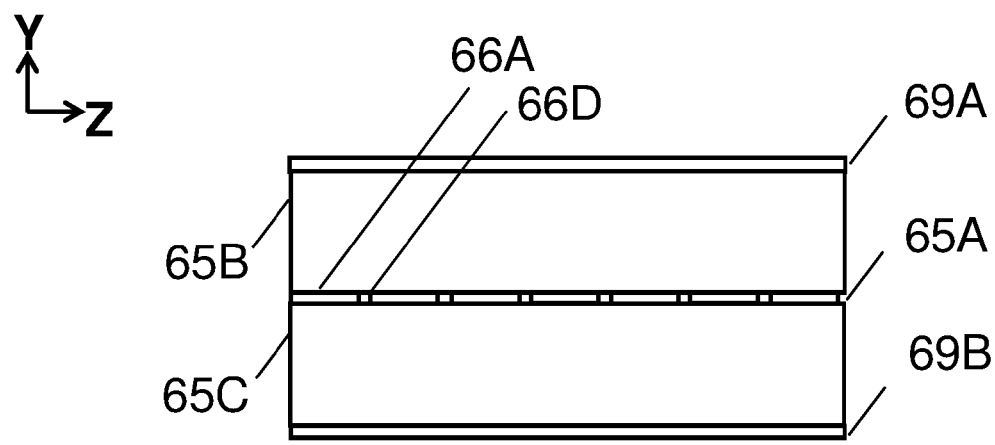
FIG. 30 is a front elevation view of the detector waveguide in the embodiment of FIG. 28A showing a cross section of the SBG array.

FIG. 28B and FIG. 28C are plan views of the bottom and top surfaces 69A,69B of the detector. The bottom surface 69A of the detector (that is, the one nearest the scanner) has alternating clear regions such as 39A and regions to which a frost etch has been applied such as 39B. The top surface 9B of the detector (that is, the one nearest the platen has alternating clear regions such as 39C and regions 39D to which an infrared absorbing thin film has been applied. The infrared absorbing coating regions of the top surface overlay the clear regions of the bottom surface. FIG. 28D is a cross section 39E of the detector waveguide showing light spots, such as 296, emerging from the waveguiding structure of FIGS. 28B-28C. Cross section views of the detector waveguide showing the SBG array, substrates and upper and lower surface coatings are provided in FIGS. 29-30. As indicated in FIG. 30 the SBG array comprises the column elements 66A separated by small gaps 66D. The external faces of the detector waveguide and the illuminator waveguide abut an air space or a low refractive index material layer.

Figures 31A, 31B:
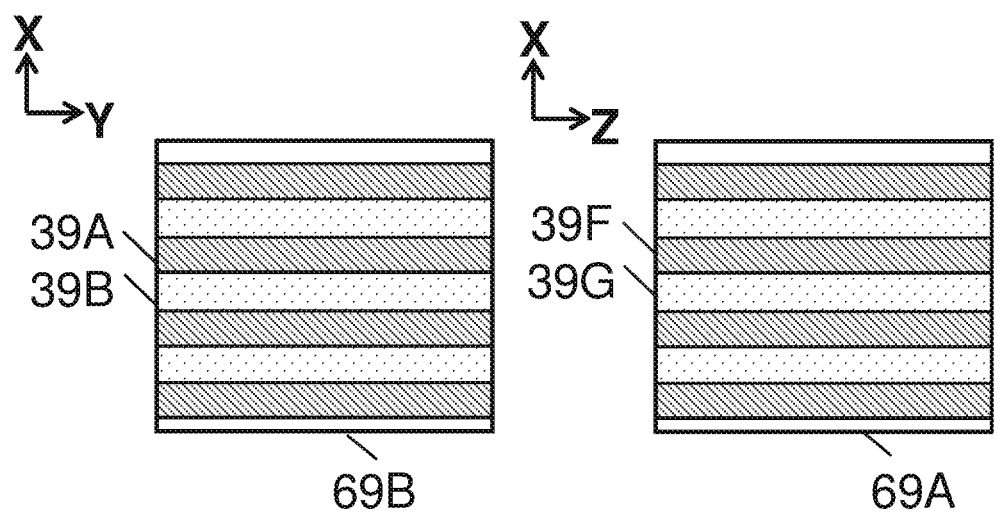
FIG. 31A shows an alternative configuration of the strips on a first external surface of the detector waveguide of FIG. 28A.
FIG. 31B shows an alternative configuration of the strips on a second external surface of the detector waveguide of FIG. 28A.

Collimated reflected beams from the platen enter the detector layer in the gaps between the IR absorbing stripes and undergo TIR within up to the detector array as indicated by the rays 293,294. Hence the beam propagation is analogous to that provided by waveguide cavities. Since there will be collimation errors owing to imperfections in the lasers collimation optics and a small amount of scatter from the PDLC material and optical interfaces, there is a risk of cross talk between adjacent detector channels as indicted by the ray 295. The combination of the IR absorbing layers and frosted surfaces overcome this problem. Light scattered out of a give channel is scattered by the frosted layer and absorbed by the IR coating. Any forward scattered light or multiple scatter between near neighboring channels will tend to diminish in intensity with each ray surface interaction and will form a background noise level that can be subtracted from the fingerprint signature by the processing software. In one embodiments shown in FIG. 31 a variation on the above detector design uses alternating clear regions of IR absorber stripes at the top (39A,39B) and bottom (39F,39G) of the waveguide instead of the IR absorber/frost etch arrangement of FIGS. 28B-28C.

Figure 32:
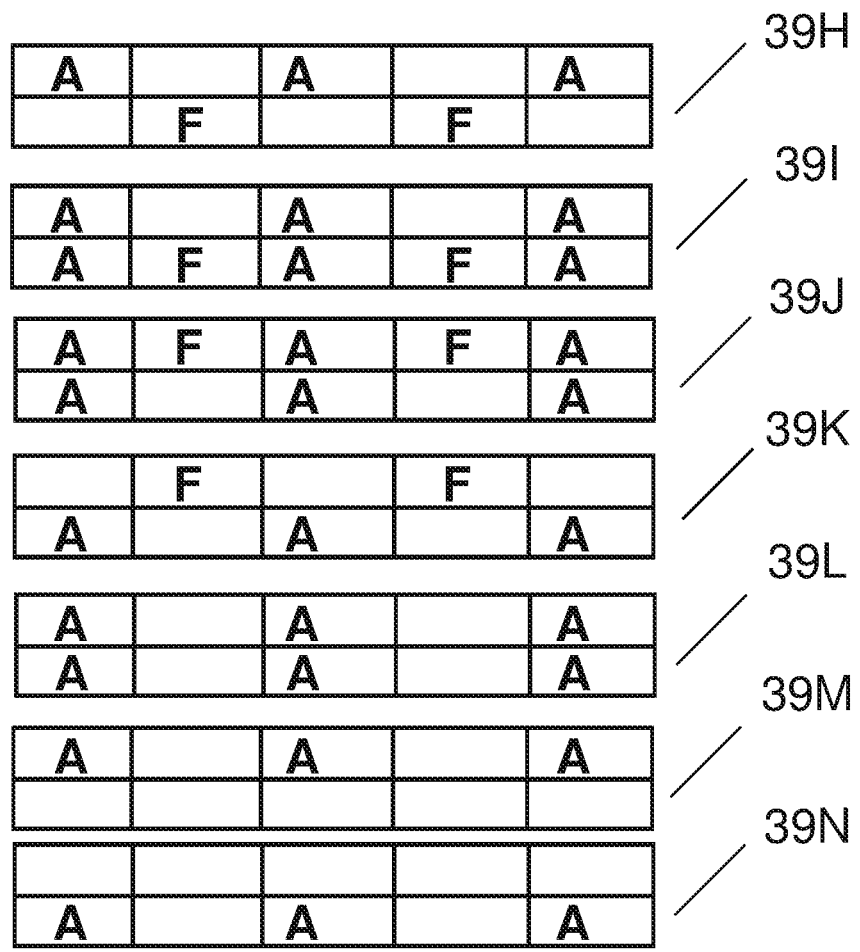
FIG. 32 shows alternative of strip configurations that may be used on the external surfaces of the detector waveguide of FIG. 28A.

As shown in FIG. 32 many different combinations of strips may be used. The strip combinations are illustrated schematically by the 5×2 matrices labelled 38H-39N in which the top row represents the strips applied to the upper surface of the detector waveguide and the bottom row represents the strips applied to the bottom surface of the detector waveguide. The light-modifying strips are labelled by characters A (absorbing), F (frosted). The matrix cells containing no characters indicate clear strips.

It should be noted that in most implementations whether a particular strip pattern is at the top or bottom of the waveguide is not critical. It is of course necessary to ensure that at least one of the strips on the waveguide surface nearest the platen is transparent to allow light reflected from the platen to enter the detector waveguide.

In one embodiment the scanner SBG operates in reverse mode. That is the SBG columns diffract only when an electric field is applied across the ITO electrodes. With normal mode SBGs the noise from diffraction and scatter occurring within the gaps between the electrodes would swamp the optical signal.

Figure 33:
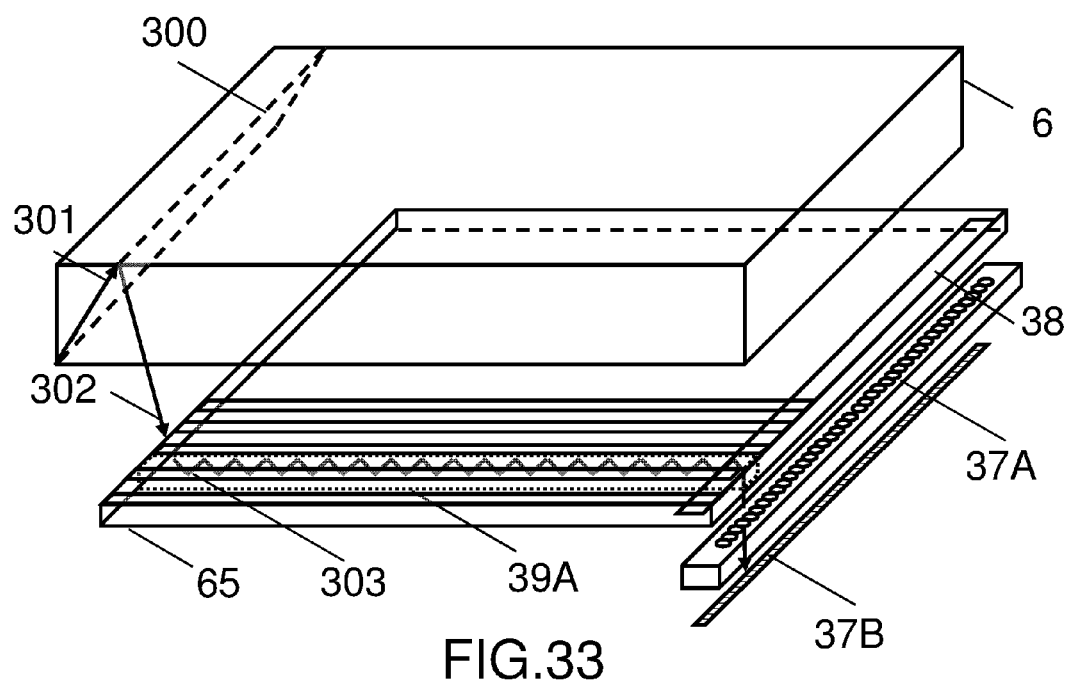
FIG. 33 is a schematic three dimensional view showing the platen and detector waveguide in one embodiment in which the detector waveguide is coupled to the detector by means of a micro lens array.
Figure 34:
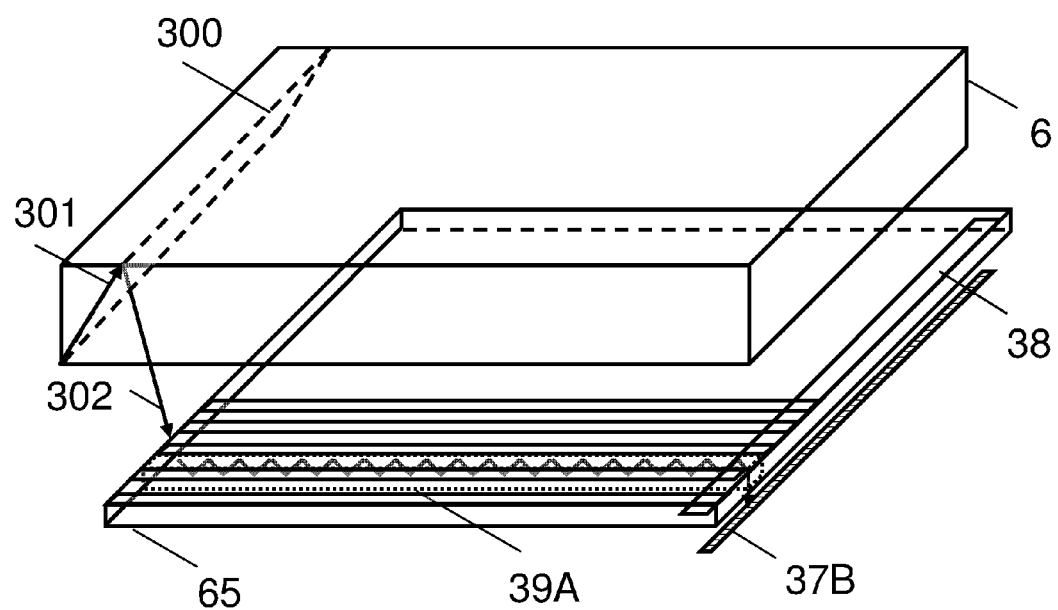
FIG. 34 is a schematic three dimensional view showing the platen and detector waveguide in one embodiment in which the detector waveguide is directly coupled to the detector.

The linear array of photo detectors 37B, is connected to the detector layer via an array of micro lenses 37A as shown in the schematic illustration of FIG. 33. Alternatively, the detector may marry up directly to the frosted surface of the detector layer as shown in FIG. 34. The illumination of the platen outer surface by a light sheet 300 containing the incident ray 301 which is reflected into the ray path 302 and is coupled into a TIR path 303 incised a waveguide region 39A of the detector waveguide 65 is shown. The TIR light is coupled via a microlens array 37A into an element of the detector array 37B by means of an outcoupling grating 38.

The linear detector may be based on any fast, high resolution array technology. One candidate technology would be CCD. An alternative technology that may be used is the Contact Image Sensors (CIS) which is rapidly replacing CCDs in low cost low power and portable applications such as copiers, flatbed scanners as well as barcode readers and optical identification technology. A typical CIS will provide high speed sensing; high speed ADC 12 bit 600 dpi. At the time of writing an exemplary CIS is the Mitsubishi Electric WC6R305X device. Current CIS devices will not have as high sensitivity as the best commercially available CCD arrays. With collimated laser illumination a CIS detector can be highly power efficient, allowing scanners to be powered through the minimal line voltage supplied via a USB connection. From an ergonomic perspective, a CIS contact sensor is smaller and lighter than a CCD line sensor, and allows all the necessary optical elements to be included in a compact module, thus helping to simplify the inner structure of the scanner. The CIS greatly simplifies the sensor electronics. Many other detector configurations may be used with the invention. In one embodiment two linear arrays may be combined. However, such embodiments require complicated waveguiding and electronics routing and output signal stitching.

In one embodiment a method of making a contact image measurement using the apparatus of FIG. 28 is provided comprising the steps of:

a) providing an apparatus comprising: an illumination means for providing a collimated beam of first polarization light; an illuminator waveguide for propagating light in a first TIR beam direction containing a first array of switchable grating columns; a detector waveguide for propagating light in a first TIR beam direction containing a second array of switchable grating columns; a beam steering means comprising at least one grating disposed between the platen and the detector waveguide; a first waveguide coupler for coupling light from the illumination means into the illuminator waveguide; a platen; a second waveguide coupler for coupling light out of the detector waveguide into an output optical path; and a detector comprising at least one photosensitive element. The external surfaces of the detector waveguide comprise interspersed multiplicities of strips with different light modifying characteristics. The strips are orthogonal to the switchable grating columns, each light modifying strip overlapping a clear strip;
b) coupling light from the illumination means into the illuminator waveguide;
c) an external material contacting a point on the external surface of the platen;
d) sequentially switching elements of the first switchable grating array into a diffracting state, all other elements being in their non-diffracting states;
e) sequentially switching columns of the second switchable grating array into a diffracting state, all other columns being in their non-diffracting states;
f) each diffracting switchable grating element of the first switchable grating array diffracting incident first TIR light upwards into a first optical path;
g) the beam steering means deflecting the first optical path light into a second optical path;
h) a portion of the second optical path light incident at the point on the platen contacted by the external material being transmitted out of the platen, portions of the second optical path light not incident at the point being reflected into a third optical path;
i) an active switchable grating column element of the second switchable grating array along the third optical path diffracting the third angle light in a second TIR path; and
j) coupling light out of the detector waveguide towards the detector.

Figure 35:
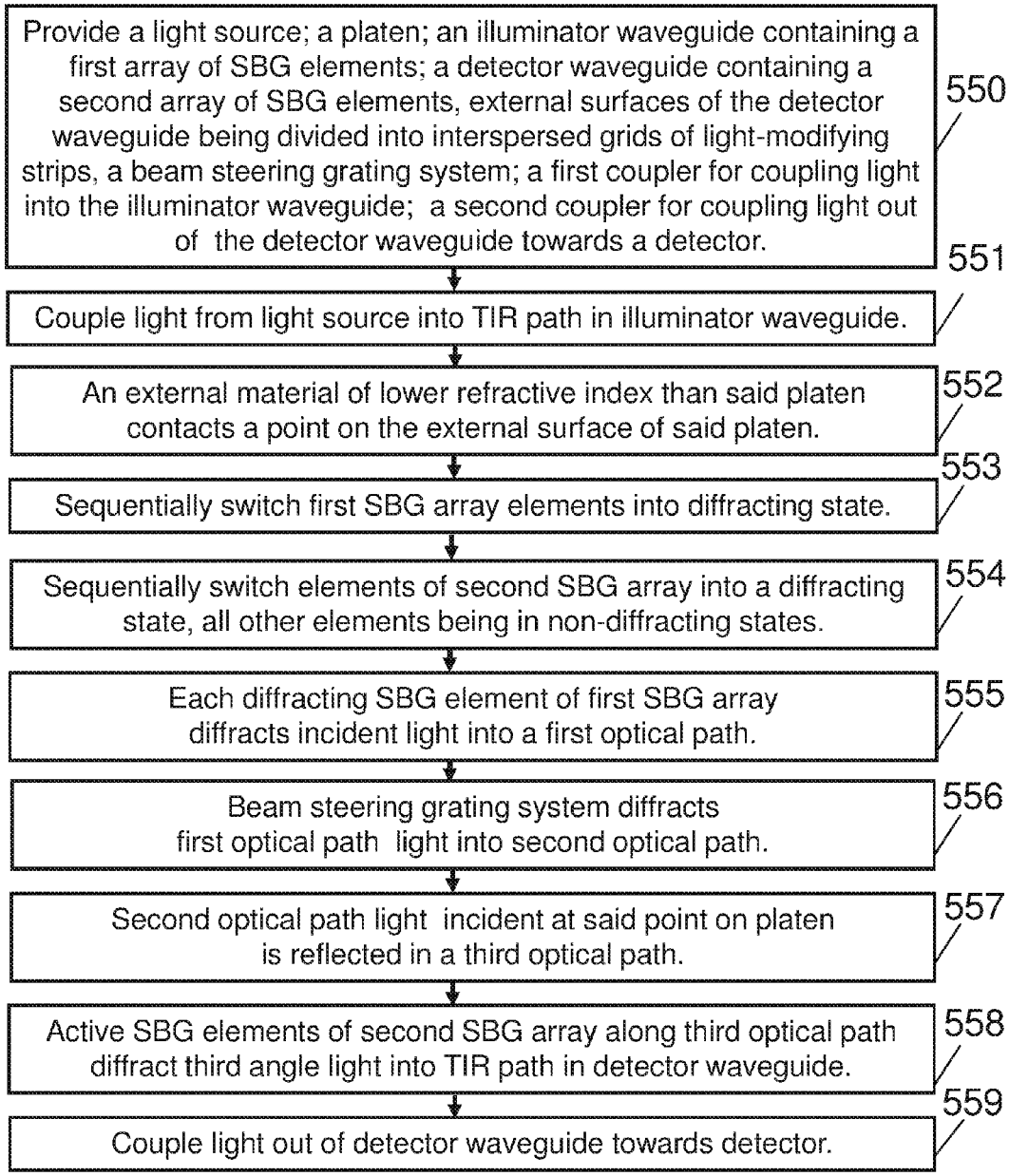
FIG. 35 is a flow chart illustrating a method of making a contact image measurement using the apparatus of FIG. 28A.

A method of making a contact image measurement in one embodiment of the invention (using the apparatus of FIG. 28) in accordance with the basic principles of the invention is shown in the flow diagram in FIG. 35. Referring to the flow diagram, we see that the said method comprises the following steps.

At step 550 provide a light source; a platen; an illuminator waveguide containing a first array of SBG elements; a detector waveguide containing a second array of SBG elements, external surfaces of the detector waveguide being divided into interspersed grids of light-modifying strips, a beam steering grating system; a first coupler for coupling light into the illuminator waveguide; a second coupler for coupling light out of the detector waveguide towards a detector.

At step 551 couple light from light source into TIR path in illuminator waveguide.

At step 552 an external material of lower refractive index than said platen contacts a point on the external surface of said platen.

At step 553 sequentially switch first SBG array elements into diffracting state.

At step 554 sequentially switch elements of second SBG array into a diffracting state, all other elements being in non-diffracting states.

At step 555 each diffracting SBG element of first SBG array diffracts incident light into a first optical path.

At step 556 beam steering grating system diffracts first optical path light into second optical path.

At step 557 second optical path light incident at said point on platen is reflected in a third optical path.

At step 558 active SBG elements of second SBG array along third optical path diffract third angle light into TIR path in detector waveguide.

At step 559 couple light out of detector waveguide towards detector.

Figure 36A:
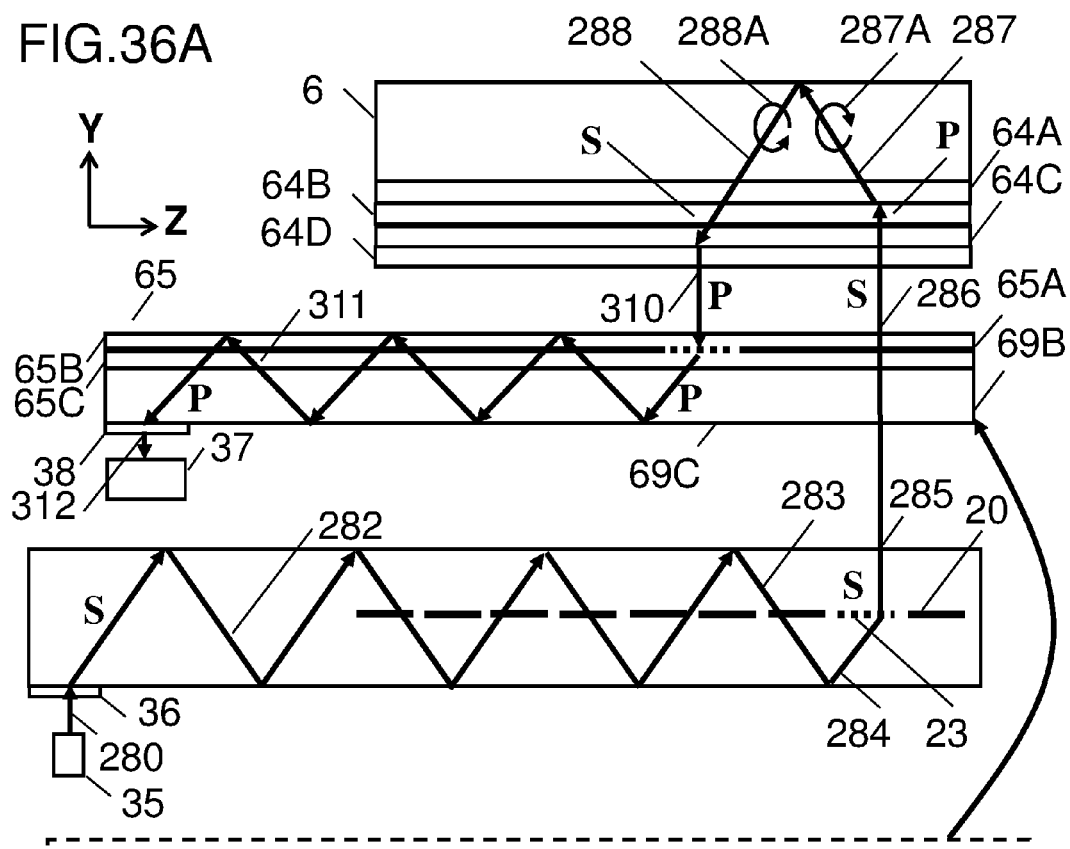
FIG. 36A is a side elevation view of a contact image sensor in one embodiment of the invention in which the detector comprises a SBG array and a waveguide array and external surfaces of the waveguide array is divided into interspersed grids of strips having different light-modifying characteristics to provide a multiplicity of parallel waveguiding paths.
Figure 36B:
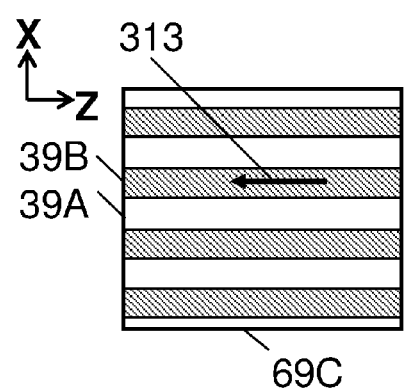
FIG. 36B is a detail of the embodiment of FIG. 36A showing a plan view of the interspersed grid of strips on the external surface.
Figure 36C:
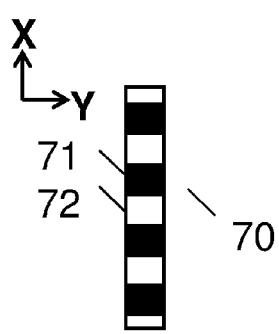
FIG. 36C is a cross sectional view of the waveguide array in the embodiment of FIG. 3.6A.

FIG. 36 shows a further embodiment of the invention that combines polymer waveguides of the type discussed earlier with the light modifying stripe principle used in the embodiment of FIG. 28. Since the basic principles of the ray propagation and diffraction by elements of the SBG arrays have already been discussed in some detail in relation to the embodiment of FIG. 28 only an outline description is provided here. The platen, beam steering grating layers and illuminator waveguide are identical to the ones illustrated in FIG. 28. However, the detector waveguide comprises a polymer waveguide layer 69C onto which is overlaid a SBG array 65 comprising the SBG array 65A sandwiched by the substrates 65B,65C to which electrodes are applied as discussed above. The upper surface of the substrate 65B which is labelled 69D in the plan view of FIG. 36D has infrared absorbing stripes 39A interspersed with clear stripes 39B. The waveguide layer 70 comprises waveguide cores 71 in cladding material 72 with the beam propagation direction generally indicated by 313 The design issues relating to the design of waveguides for use with the invention have been discussed in detail earlier (see FIGS. 4-11 and the accompanying description). The ray path from the source to the detector 37 is indicated by the rays 280-312.

Figure 37A:
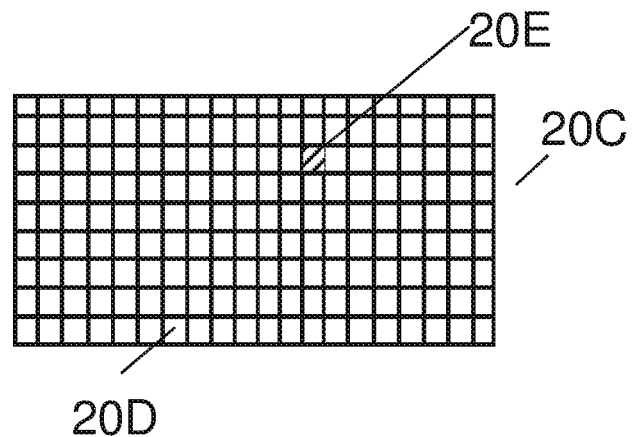
FIG. 37A is a plan view of a first operational state of a two dimensional SBG array used in the at least one of the detector and illuminator waveguides in one embodiment.
Figure 37B:
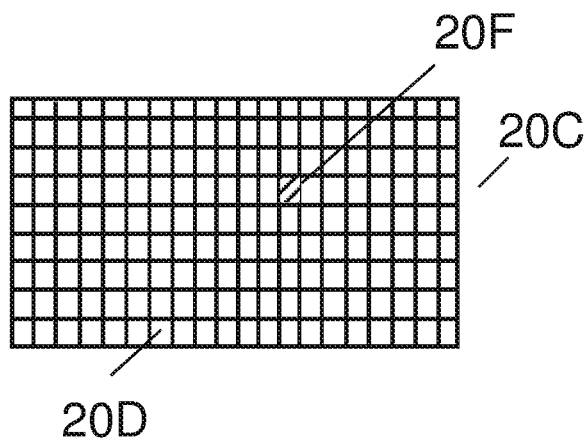
FIG. 37B is a plan view of a second operational state of a two dimensional SBG array used in the at least one of the detector and illuminator waveguides in one embodiment of the invention.

Although the switchable grating arrays used in the detector and illuminator waveguide components essentially one dimension arrays of column shaped elements (as shown in FIG. 3) it is possible to apply the invention using two dimensional arrays. FIG. 37 shows two operational states of a two-dimensional switchable grating array 20C (for use in one or both of the detector and illumination SBG arrays) containing addressable pixels 20D. In FIG. 37A a pixel 20E is in a diffracting state while in FIG. 37B a neighboring pixel 20F is in a diffracting state. The pixels could be switched one column at a time. However, the real benefit of two dimensional arrays lies in enabling more sophisticated image sensing strategies, for example area-of-interest-based image acquisition. Such applications of the invention will require fast detectors and fast switching of the grating arrays.

Figure 38:
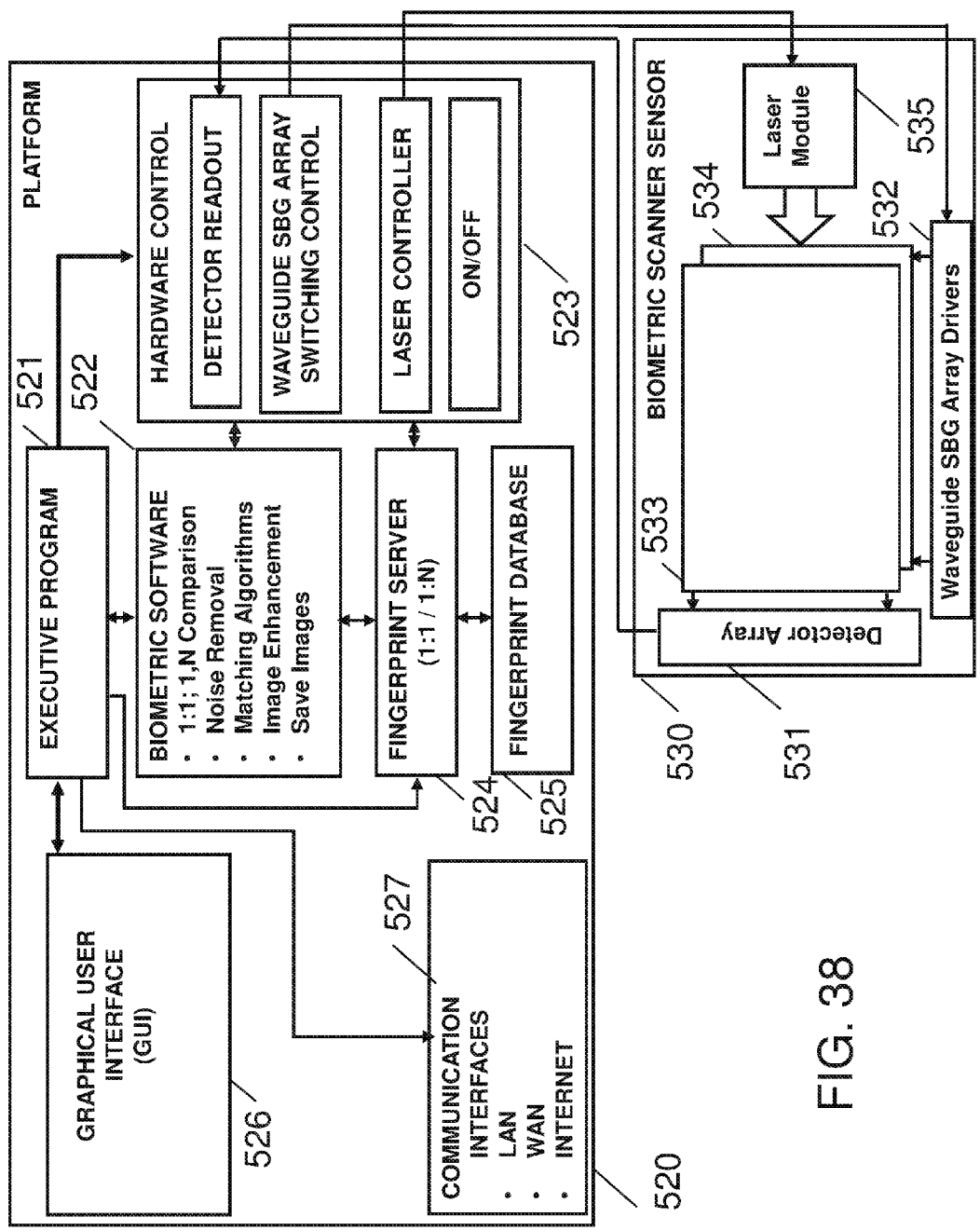
FIG. 38 is a block diagram illustrating the key system modules of a software platform for use with a contact image sensor for finger print sensing in one embodiment of the invention.

FIG. 38 shows a preliminary software architecture for use in a fingerprint scanning implementation of the invention. In a typical mobile application of the invention the preferred software platform would be a ruggedized computer tablet such as, for example, the Panasonic Android Touchpad. It is anticipated that Microsoft Windows 8 computer tablet technology will stimulate further product development in these areas. Desirably, any platform should provide an integrated GPS module. FIG. 38 illustrates one possible implementation. The system components implemented on the software platform 520 comprise an executive program 521, biometric software 522, hardware control 523, finger print server 524, fingerprint database 525, graphical user interface (GUI)526 and communication interfaces 527. The biometric software will typically provide 1:1 and 1;N comparisons; noise removal, matching algorithms, image enhancement and options for saving images. The hardware control module includes software for control the electronics for detector channel switching and readout, illuminator component switching, laser control and basic functions such as an on/off switch. Communication interfaces will typically include LAN, WAN and INTERNET. FIG. 38 also shows the biometric scanner 530 comprising a 512 element detector array 531, SBG array driver 532, detector 533, illuminator component 534 and laser module 535. System Development Kits (SDKs) for implementing the functionalities shown in FIG. 39 are currently available. They can be categorized into low and high level tools. While low level tools can provide rapid integration they still require the development of a robust fingerprint reader software matching server and other vital elements for dealing with problems such as exception handling and system optimization, which makes embedding them into applications problematic. When modifications or enhancements are made to either the host application or to the fingerprint SDK the host software must be recompiled with the fingerprint SDK, leading to ongoing support and maintenance problems. High level SDKs free the user from needing to understand the parameters involved with fingerprint comparison, how they work, why they are significant, and how data needs to be extracted from an image as well as data type mapping, database management, data synchronization, exception handling. The ability to perform 1:N comparison for large databases is a highly desirable feature important feature; opening a record set from the database and matching one-by-one will not produce fast results. In general, high level SDKs will be better at handling poor image quality, bad image acquisition, and unpredictable user input. Desirably the SDK should support a variety of development environments including: C++, VB, NET, Delphi, PowerBuilder, Java, Clarion, and web applications. High level SDKs avoid the need for development of special DLLs which can consume 6-12 months in development.

In applications such as finger print sensing the illumination light is advantageously in the infrared. In one embodiment of the invention the laser emits light of wavelength 785 nm. However, the invention is not limited to any particular illumination wavelength.

In fingerprint detection applications the invention may be used to perform any type "live scan" or more precisely any scan of any print ridge pattern made by a print scanner. A live scan can include, but is not limited to, a scan of a finger, a finger roll, a flat finger, a slap print of four fingers, a thumb print, a palm print, or a combination of fingers, such as, sets of fingers and/or thumbs from one or more hands or one or more palms disposed on a platen. In a live scan, for example, one or more fingers or palms from either a left hand or a right hand or both hands are placed on a platen of a scanner. Different types of print images are detected depending upon a particular application. A flat print consists of a fingerprint image of a digit (finger or thumb) pressed flat against the platen. A roll print consists of an image of a digit (finger or thumb) made while the digit (finger or thumb) is rolled from one side of the digit to another side of the digit over the surface of the platen. A slap print consists of an image of four flat fingers pressed flat against the platen. A palm print involves pressing all or part of a palm upon the platen.

The present invention essentially provides a solid state analogue of a mechanical scanner. The invention may be used in a portable fingerprint system which has the capability for the wireless transmission of fingerprint images captured in the field to a central facility for identity verification using an automated fingerprint identification system.

It should be emphasized that the drawings are exemplary and that the dimensions have been exaggerated.

It should be understood by those skilled in the art that while the present invention has been described with reference to exemplary embodiments, it is to be understood that the invention is not limited to the disclosed exemplary embodiments. Various modifications, combinations, sub-combinations and alterations may occur depending on design requirements and other factors insofar as they are within the scope of the appended claims or the equivalents thereof.

What is claimed is:

1. A contact image sensor comprising:
 an illumination source providing a collimated beam of first polarization light;
 an illuminator waveguide for propagating light in a first TIR path containing a first array of -grating columns;
 a detector comprising at least one photosensitive element;
 a platen;
 a detector waveguide for propagating light in a second total internal reflection (TIR) path containing a second array of grating columns;
 at least one beam steering grating disposed between said platen and said detector waveguide;
 a first waveguide coupler for coupling light from said illumination source into said illuminator waveguide; and,
 a second waveguide coupler for coupling light out of said detector waveguide into an output optical path;
 wherein each external surface of said detector waveguide is divided into a first grid of strips interspersed with a second grid of strips, said first and second grids having different light-modifying characteristics, overlapping strips from the first grid of strips on each external surface being operative to waveguide light, overlapping strips from the second grid of strips on each external surface being operative to absorb light scattered out of regions of the detector waveguide sandwiched by overlapping strips from the first grid of strips on each external surface, said strips being orthogonal to said grating columns.

2. The apparatus of claim 1 wherein each said grating element in at least one of said first and second grating arrays is switchable between a diffracting state and a non-diffracting state, said switchable grating elements diffracting only said first polarization light.

3. The apparatus of claim 1 wherein the first grid of each said external waveguide surface is one of clear or scattering and the second grid of at least one said external waveguide surface is infrared absorbing.

4. The apparatus of claim 1 wherein in each waveguide said grating columns are orthogonal to said TIR paths.

5. The apparatus of claim 2 wherein said columns in said first and second grating arrays are switched in cyclic fashion with only one said column element in each array being in a diffracting state at any time.

6. The apparatus of claim 1 wherein said first and second TIR paths are parallel.

7. The apparatus of claim 1 wherein said beam steering grating comprises: a first transmission grating layer; a half wavelength retarder layer overlaying said first transmission grating layer; a second transmission grating layer overlaying said half wavelength retarder layer; and a quarter wavelength retarder layer sandwiched by said second transmission grating layer and said platen.

8. The apparatus of claim 1 wherein external faces of said detector waveguide and said illuminator waveguide abut an air space or a low refractive index material layer.

9. The apparatus of claim 2 wherein said illuminator and detector waveguides each comprise first and second transparent substrates sandwiching said array of grating columns, and transparent electrodes applied to opposing faces of said substrates.

10. The apparatus of claim 2 wherein said grating is one of a forward mode SBG, reverse mode SBG, or stack of thin switchable gratings.

11. The apparatus of claim 2 wherein said diffracting state exists when an electric field is applied across said grating element and said non diffracting states exists when no electric field is applied.

12. The apparatus of claim 2 wherein said diffracting state exists when no electric field is applied across said grating element and said non diffracting states exists when an electric field is applied.

13. The apparatus of claim 2 wherein at any time one element of said first grating array is in a diffracting state, one element of said second grating array is in a diffracting state, all other elements of said first and second grating arrays are in a non-diffracting state.

14. The apparatus of claim 1 wherein said first waveguide coupler couples light from said illumination source into first TIR path in said illuminator waveguide, wherein an grating element of said illuminator waveguide in a diffracting state diffracts said first TIR path light towards said platen into a first beam direction, wherein said beam steering grating deflects said first beam direction light towards said platen in a second beam direction, wherein when contact is made with an external material at a point on the platen a portion of the second beam direction light incident at the point on the platen contacted by said external material is transmitted out of the platen, wherein light incident on the outer surface of the platen in the absence of said contact with an external material is reflected towards said detector waveguide in a third optical path, wherein a column of said second grating array along said third beam direction diffracts said third angle light into a second TIR path in said detector waveguide; wherein said second waveguide coupler couples said second TIR path light into an output optical path towards said detector; wherein said first to third optical paths and said first and second TIR paths are in a common plane.

15. The apparatus of claim 14 wherein said first direction light traverses said detector waveguide.

16. The apparatus of claim 14 wherein said second direction light traverses said illuminator waveguide.

17. The apparatus of claim 2 wherein the output from detector array element is read out in synchronism with the switching of the elements of said first switchable grating array.

18. A method of making a contact image measurement comprising the steps of:
a) providing an apparatus comprising: an illumination source providing a collimated beam of first polarisation light; an illuminator waveguide for propagating light in a first TIR beam direction containing a first array of switchable grating columns; a detector waveguide for propagating light in a first TIR beam direction containing a second array of switchable grating columns, external surfaces of said detector waveguide comprising interspersed multiplicities of strips with different light modifying characteristics, said strips orthogonal to said switchable grating columns, each light modifying strip overlapping a clear strip; a platen; a beam steering grating comprising at least one grating disposed between said platen and said detector waveguide; a first waveguide coupler for coupling light from said illumination source into said illuminator waveguide; a second waveguide coupler for coupling light out of said detector waveguide into an output optical path; and a detector comprising at least one photosensitive element;
b) coupling light from said illumination source into said illuminator waveguide;
c) an external material contacting a point on the external surface of said platen;
d) sequentially switching elements of said first switchable grating array into a diffracting state, all other elements being in their non-diffracting states;
e) sequentially switching columns of said second switchable grating array into a diffracting state, all other columns being in their non-diffracting states;
f) each diffracting switchable grating element of said first switchable grating array diffracting incident first TIR light upwards into a first optical path;
g) said beam steering grating deflecting said first optical path light into a second optical path;
h) a portion of said second optical path light incident at said point on said platen contacted by said external material being transmitted out of said platen, portions of said second optical path light not incident at said point being reflected into a third optical path;
i) an active switchable grating column element of said second switchable grating array along said third optical path diffracting said third angle light in a second TIR path; and
j) coupling light out of said detector waveguide towards said detector;
wherein said first to third optical paths and said first and second TIR paths are in a common plane.

19. The apparatus of claim 1 wherein said columns of said first and second switchable grating arrays are switched in cyclic fashion with only one said column element in each array being in a diffracting state at any time.

* * * * *